US012716448B2

(12) United States Patent
Shi et al.

(10) Patent No.: US 12,716,448 B2
(45) Date of Patent: Aug. 25, 2026

(54) HINGE MECHANISM AND ELECTRONIC DEVICE

(71) Applicant: Huawei Technologies Co., Ltd., Shenzhen (CN)

(72) Inventors: Tuo Shi, Shanghai (CN); Hewen Shen, Dongguan (CN); Yong Liu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 195 days.

(21) Appl. No.: 18/819,291

(22) Filed: Aug. 29, 2024

(65) Prior Publication Data

US 2024/0418208 A1 Dec. 19, 2024

Related U.S. Application Data

(63) Continuation of application No. PCT/CN2024/080843, filed on Mar. 8, 2024.

(30) Foreign Application Priority Data

Apr. 27, 2023 (CN) ........................ 202310481760.8

(51) Int. Cl.
*H05K 5/00* (2025.01)
*F16C 11/00* (2006.01)
(Continued)

(52) U.S. Cl.
CPC ............ *F16C 11/04* (2013.01); *H05K 5/0226* (2013.01)

(58) Field of Classification Search
CPC ..... F16C 11/04; H05K 5/0226; G06F 1/1616; G06F 1/1681; G06F 1/1652; G09F 9/301;
(Continued)

(56) References Cited

U.S. PATENT DOCUMENTS 9,910,465 B2 * 3/2018 Tazbaz ................ H04M 1/0216
10,303,223 B2 * 5/2019 Park ...................... G06F 1/1681
(Continued)

FOREIGN PATENT DOCUMENTS

CN 101799065 A 8/2010
CN 104575228 A 4/2015
(Continued)

*Primary Examiner* — Rockshana D Chowdhury
(74) *Attorney, Agent, or Firm* — Conley Rose, P.C.

(57) ABSTRACT

The hinge mechanism includes a main shaft and a synchronization assembly, the synchronization assembly includes a first gear assembly and a second gear assembly, the first gear assembly includes a first gear connecting rod and a third gear connecting rod that are rotatably coupled, and the second gear assembly includes a second gear connecting rod and a fourth gear connecting rod that are rotatably coupled. The main shaft includes a rotating support member. The first gear connecting rod and the rotating support member are rotatably coupled via gear surfaces that are engaged with each other, the second gear connecting rod and the rotating support member are rotatably coupled via gear surfaces that are engaged with each other, and the third gear connecting rod and the fourth gear connecting rod are rotatably coupled via gear surfaces that are engaged with each other.

20 Claims, 12 Drawing Sheets

(51) Int. Cl.
*F16C 11/04* (2006.01)
*H05K 5/02* (2006.01)

(58) Field of Classification Search
CPC ... H04M 1/022; H04M 1/0268; H04M 1/0216
See application file for complete search history.

(56) References Cited

U.S. PATENT DOCUMENTS

| | | | | |
|---|---|---|---|---|
| 10,545,541 | B1 * | 1/2020 | Dighde | E05D 3/122 |
| 11,224,137 | B2 * | 1/2022 | Hsu | E05D 11/0081 |
| 11,385,687 | B1 * | 7/2022 | Kim | G06F 1/1616 |
| 11,778,764 | B2 * | 10/2023 | Zhang | H05K 5/0226<br>361/807 |
| 11,832,405 | B2 * | 11/2023 | Zhang | F16C 11/04 |
| 11,920,395 | B2 * | 3/2024 | Quynh | E05D 3/122 |
| 11,983,047 | B2 * | 5/2024 | Park | G06F 1/1624 |
| 12,066,872 | B2 * | 8/2024 | Kim | G06F 1/16 |
| 12,314,088 | B2 * | 5/2025 | Son | G06F 1/1652 |
| 12,360,574 | B2 * | 7/2025 | Yun | H05K 5/0017 |
| 12,366,896 | B2 * | 7/2025 | Zhang | G06F 1/1681 |
| 12,389,558 | B2 * | 8/2025 | Shin | G06F 1/1616 |
| 12,457,281 | B2 * | 10/2025 | Huang | G06F 1/1652 |
| 12,487,643 | B2 * | 12/2025 | Xu | G06F 1/1652 |
| 12,500,967 | B2 * | 12/2025 | Park | H04M 1/022 |
| 12,565,910 | B2 * | 3/2026 | Zhang | F16C 11/04 |
| 2021/0116975 | A1 * | 4/2021 | Moon | G06F 1/1616 |
| 2021/0181808 | A1 | 6/2021 | Liao et al. | |
| 2026/0016867 | A1 * | 1/2026 | Yen | G06F 1/1681 |

FOREIGN PATENT DOCUMENTS

| | | | |
|---|---|---|---|
| CN | 206999698 | U | 2/2018 |
| CN | 207787588 | U | 8/2018 |
| CN | 109719242 | A | 5/2019 |
| CN | 209351449 | U | 9/2019 |
| CN | 110397382 | A | 11/2019 |
| CN | 209761226 | U | 12/2019 |
| CN | 109936648 | B | 8/2020 |
| CN | 115451008 | A | 12/2022 |
| CN | 115539490 | A | 12/2022 |
| EP | 4063674 | A1 | 9/2022 |
| EP | 4131900 | A1 | 2/2023 |

* cited by examiner

HINGE MECHANISM AND ELECTRONIC DEVICE

CROSS-REFERENCE TO RELATED APPLICATIONS

This is a continuation of International Patent Application No. PCT/CN2024/080843 filed on Mar. 8, 2024, which claims priority to Chinese Patent Application No. 202310481760.8 filed on Apr. 27, 2023. The disclosures of the aforementioned applications are hereby incorporated by reference in their entireties.

TECHNICAL FIELD

This disclosure relates to the field of electronic device technologies, and in particular, to a hinge mechanism and an electronic device.

BACKGROUND

Gradual maturity of flexible display technologies brings great changes to display of an electronic device. Foldable mobile phones, tablet computers, or wearable electronic devices with flexible displays, are an important trend of evolutions for intelligent electronic devices in the future.

A key component of a foldable electronic device is a flexible display featured by continuousness and foldability. A hinge mechanism, as an important component for folding the foldable electronic device, can drive the flexible display to be flattened or bent in unfolding and folding processes of the foldable electronic device. With the improvement of economy, users impose higher requirements for the foldable electronic device, and structural reliability of the flexible display is a key factor that affects user experience. Therefore, how to improve the structural reliability of the flexible display has become a topic widely studied by a person skilled in the art currently.

SUMMARY

This disclosure provides a hinge mechanism and an electronic device, to improve structural reliability of a flexible display of the electronic device, thereby improving structural reliability of the electronic device.

According to a first aspect, this disclosure provides a hinge mechanism. The hinge mechanism may be used in a foldable electronic device, the hinge mechanism is disposed corresponding to a bendable part of a flexible display of the electronic device, and the electronic device is unfolded or folded via the hinge mechanism. During specific disposing, the hinge mechanism may include a main shaft, a synchronization assembly, a first housing mounting bracket, and a second housing mounting bracket. The synchronization assembly includes a first gear assembly and a second gear assembly, the first gear assembly includes a first gear connecting rod and a third gear connecting rod, the first gear connecting rod includes a first gear and a first connecting rod, the first connecting rod is slidably connected to the first housing mounting bracket, the third gear connecting rod includes a third gear and a third connecting rod, and the third connecting rod is rotatably connected to the first gear connecting rod. The second gear assembly includes a second gear connecting rod and a fourth gear connecting rod, the second gear connecting rod includes a second gear and a second connecting rod, the second connecting rod is slidably connected to the second housing mounting bracket, the fourth gear connecting rod includes a fourth gear and a fourth connecting rod, and the fourth connecting rod is rotatably connected to the second gear connecting rod. In addition, the main shaft includes a rotating support member, the first gear connecting rod and the second gear connecting rod are respectively disposed on two opposite sides of the rotating support member, a first gear surface is disposed at an end part that is of the rotating support member and that faces the first gear, a second gear surface is disposed at an end part that is of the rotating support member and that faces the second gear, the first gear surface is engaged with a gear surface of the first gear, the second gear surface is engaged with a gear surface of the second gear, and a gear surface of the third gear is engaged with a gear surface of the fourth gear.

According to the hinge mechanism provided in this disclosure, in a process in which the electronic device changes from an unfolded state to a folded state, the first housing mounting bracket rotates around the main shaft clockwise to drive the first connecting rod to slide relative to the first housing mounting bracket toward the base, to drive the first gear connecting rod to rotate around the main shaft clockwise. The first gear connecting rod rotates around the main shaft clockwise to drive the third gear connecting rod to rotate along a same direction. In addition, because the third gear connecting rod and the fourth gear connecting rod are engaged via the gear surfaces, the third gear connecting rod rotates clockwise to drive the fourth gear connecting rod to rotate synchronously counter-clockwise, and the fourth gear connecting rod may drive the second gear connecting rod to rotate along a same direction, so that the second connecting rod slides relative to the second housing mounting bracket to drive the second housing mounting bracket and the second gear connecting rod to rotate along a same direction. In this way, the first housing mounting bracket and the second housing mounting bracket synchronously rotate toward each other. In addition, in a process in which the electronic device changes from the folded state to the unfolded state, a movement direction of each structure is opposite to a movement direction of each structure in a process in which the electronic device changes from the unfolded state to the folded state. Details are not described herein. In this case, the first housing mounting bracket and the second housing mounting bracket synchronously rotate away from each other. In the hinge mechanism provided in this disclosure, because synchronous rotation of the first gear assembly and the second gear assembly of the synchronization assembly is implemented by using two levels of gear surfaces that are engaged with each other, high-precision gear transmission can be implemented. In addition, by using the structure design, when the first gear assembly and the second gear assembly are rotatably connected to the main shaft, the main shaft may perform less avoidance for the two gear assemblies, so that a structure of the main shaft is relatively complete and strength of the main shaft is relatively good, to help improve structural reliability and movement reliability of the entire hinge mechanism.

In a possible implementation of this disclosure, the third gear is rotatably connected to the rotating support member via a first rotating shaft, and the fourth gear is rotatably connected to the rotating support member via a third rotating shaft. This helps improve reliability of connections between the third gear connecting rod and the main shaft and between the fourth gear connecting rod and the main shaft, to help improve reliability of connections between the first gear assembly and the main shaft and between the second gear assembly and the main shaft, and help improve structural reliability of the entire hinge mechanism.

In addition, the third connecting rod may be rotatably connected to the first gear via a second rotating shaft, and an axis of the first rotating shaft is parallel to and does not coincide with an axis of the second rotating shaft, so that a structure of the first gear assembly is relatively compact. Similarly, the fourth connecting rod is rotatably connected to the second gear connecting rod via a fourth rotating shaft, and an axis of the third rotating shaft is parallel to and does not coincide with an axis of the fourth rotating shaft, so that a structure of the second gear assembly is relatively compact. This can help reduce a size of the hinge mechanism.

In a possible implementation of this disclosure, the first housing mounting bracket is provided with a first sliding groove, an opening of the first sliding groove is disposed toward the main shaft, and the first connecting rod is mounted in the first sliding groove, and is capable of sliding in the first sliding groove relative to the first housing mounting bracket toward or away from the main shaft, so that the slidable connection between the first gear connecting rod and the first housing mounting bracket is implemented through the slidable connection between the first connecting rod and the first housing mounting bracket. In addition, the second housing mounting bracket is provided with a second sliding groove, an opening of the second sliding groove is disposed toward the main shaft, and the second connecting rod is mounted in the second sliding groove, and is capable of sliding in the second sliding groove relative to the second housing mounting bracket toward or away from the main shaft, so that the slidable connection between the second gear connecting rod and the second housing mounting bracket is implemented through the slidable connection between the second connecting rod and the second housing mounting bracket. In this way, in the process in which the electronic device changes from the unfolded state to the folded state or from the folded state to the unfolded state, the first housing mounting bracket and the second housing mounting bracket may synchronously rotate toward each other or away from each other via the synchronization assembly.

In a possible implementation of this disclosure, the hinge mechanism further includes a rotating module, the rotating module includes a first rotating assembly and a second rotating assembly, the first rotating assembly is located between the first housing mounting bracket and the second housing mounting bracket, and the second rotating assembly is located between the first housing mounting bracket and the second housing mounting bracket. The first rotating assembly may include a first swing arm, a first support arm, and a first connector, the first swing arm is rotatably connected to the main shaft, the first swing arm is slidably connected to the first housing mounting bracket, the first support arm is rotatably connected to the second housing mounting bracket, the first connector is located between the first swing arm and the first support arm, the first connector is rotatably connected to the first swing arm, and the first connector is rotatably connected to the first support arm. In addition, the main shaft is provided with a first track slot, and the first connector is capable of moving along the first track slot, for limitation on a movement track of the first connector, so that a track along which the first swing arm pulls, via the first connector, the first support arm to move may be limited. The second rotating assembly may include a second swing arm, a second support arm, and a second connector, the second swing arm is rotatably connected to the main shaft, the second swing arm is slidably connected to the second housing mounting bracket, the second support arm is rotatably connected to the first housing mounting bracket, the second connector is located between the second swing arm and the second support arm, the second connector is rotatably connected to the second swing arm, and the second connector is rotatably connected to the second support arm. In addition, the main shaft is provided with a second track slot, and the second connector is capable of moving along the second track slot, for limitation on a movement track of the second connector, so that a track along which the second swing arm pulls, via the second connector, the second support arm to move may be limited.

Based on the foregoing hinge mechanism in this disclosure, in the process in which the electronic device changes from the unfolded state to the folded state, the first housing mounting bracket and the second housing mounting bracket move toward each other. When the first housing mounting bracket drives the first swing arm to rotate around the main shaft clockwise, the first swing arm may drive the first connector to move toward the first swing arm in the first track slot of the main shaft, to drive the first support arm to rotate around the main shaft counter-clockwise. When the second housing mounting bracket drives the second swing arm to rotate around the main shaft counter-clockwise, the second swing arm may drive the second connector to move toward the second swing arm in the second track slot of the main shaft, to drive the second support arm to rotate around the main shaft clockwise. In the process in which the electronic device changes from the folded state to the unfolded state, the first housing mounting bracket and the second housing mounting bracket move away from each other. When the first housing mounting bracket drives the first swing arm to rotate around the main shaft counter-clockwise, the first swing arm may drive the first connector to move toward the first support arm in the first track slot of the main shaft, to drive the first support arm to rotate around the main shaft clockwise. When the second housing mounting bracket drives the second swing arm to rotate around the main shaft clockwise, the second swing arm may drive the second connector to move toward the second support arm in the second track slot of the main shaft, to drive the second support arm to rotate around the main shaft counter-clockwise. In this way, folding and unfolding functions of the hinge mechanism may be implemented.

Some other hinge mechanisms need to thicken a rotating assembly connected to a main shaft to ensure stability of the mechanisms. In this way, both the main shaft and the hinge mechanism are very heavy. If the main shaft and the hinge mechanism are forcibly thinned, strength of the rotating assembly is easily weakened, thereby greatly affecting reliability of the hinge mechanisms and shortening a life of the electronic device. The foregoing hinge mechanism in this disclosure has a simplified structure. According to the foregoing structural relationship, the first connector and the second connector slide in the main shaft to link the first swing arm, the second swing arm, the first support arm, and the second support arm on the left and right sides. Therefore, the first connector and the second connector do not need to be manufactured with very thick thickness sections to travel back and forth in the first track slot and the second track slot of the main shaft. In addition, because the first connector and the second connector are respectively connected to the first swing arm (the second swing arm) and the first support arm (the second support arm), the first connector (the second connector) has a sufficient length extension along a vertical axial direction to have sufficient strength. This can ensure reliability of the hinge mechanism. In this way, the thickness of the main shaft and the thickness of the entire electronic device can be reduced, and reliability of the hinge mechanism can be maintained, so that the entire hinge mechanism is light, thin, and reliable.

In addition, because the first connector is capable of moving in the first track slot according to a specified track, and the second connector is capable of moving in the second track slot according to a specified track, uncontrolled movement of the first connector and the second connector in an entire folding and unfolding process can be avoided, and random movement of the first housing mounting bracket and the second housing mounting bracket can further be avoided, to ensure structural stability and movement stability of the entire hinge mechanism. In some cases, the first track slot and the second track slot are appropriately designed, so that an outer tangent line of the hinge mechanism can keep a constant length in the entire folding and unfolding process, and a flexible display covering the surface of the hinge mechanism can also basically keep a length unchanged. In this way, squeezing or pulling on the flexible display can be effectively avoided, to improve structural reliability of the flexible display and further improve structural reliability of the electronic device.

In a possible implementation of this disclosure, the main shaft includes a base and a cover, the cover covers the base, the base is provided with a first arc-shaped slot, the cover includes a first protrusion disposed toward the first arc-shaped slot, and a gap between a surface of the first protrusion and a slot surface of the first arc-shaped slot may be used as the first track slot. In addition, the first connector may include a first arc-shaped surface and a second arc-shaped surface, and when the electronic device is in the unfolded state and the folded state, the first arc-shaped surface abuts against the surface of the first protrusion, and the second arc-shaped surface abuts against the slot surface of the first arc-shaped slot. In this way, the surface of the first protrusion and the slot surface of the first arc-shaped slot limit the first connector to the first track slot, so that when the hinge mechanism is in the unfolded state and the folded state, the first connector is relatively stable without any gap-caused shake, and reliability of the hinge mechanism is improved in the foregoing two states.

In addition, the base may further be provided with a third arc-shaped slot, and the cover further includes a third protrusion disposed toward the third arc-shaped slot. A gap between a surface of the third protrusion and a slot surface of the third arc-shaped slot is used as the second track slot, the second connector includes a third arc-shaped surface and a fourth arc-shaped surface, and when the electronic device is in the unfolded state and the folded state, the third arc-shaped surface abuts against the surface of the third protrusion, and the fourth arc-shaped surface abuts against the slot surface of the third arc-shaped slot. In this way, the surface of the third protrusion and the slot surface of the third arc-shaped slot limit the second connector to the second track slot, so that when the hinge mechanism is in the unfolded state and the folded state, the second connector is relatively stable without any gap-caused shake, and reliability of the hinge mechanism is improved in the foregoing two states.

In a possible implementation of this disclosure, in the process in which the electronic device changes from the unfolded state to the folded state, the first arc-shaped surface abuts against the surface of the first protrusion, and a gap exists between the second arc-shaped surface and the slot surface of the first arc-shaped slot. However, in the process in which the electronic device changes from the folded state to the unfolded state, the second arc-shaped surface abuts against the slot surface of the first arc-shaped slot, and a gap exists between the first arc-shaped surface and the surface of the first protrusion. Therefore, a movement track of the first connector in the first track slot in the process in which the electronic device changes from the unfolded state to the folded state is different from a movement track of the first connector in the first track slot in the process in which the electronic device changes from the folded state to the unfolded state. This helps improve design flexibility of the hinge mechanism.

In addition, in the process in which the electronic device changes from the unfolded state to the folded state, the third arc-shaped surface abuts against the surface of the third protrusion, and a gap exists between the fourth arc-shaped surface and the slot surface of the third arc-shaped slot. In the process in which the electronic device changes from the folded state to the unfolded state, the fourth arc-shaped surface abuts against the slot surface of the third arc-shaped slot, and a gap exists between the third arc-shaped surface and the surface of the third protrusion. Therefore, a movement track of the second connector in the second track slot in the process in which the electronic device changes from the unfolded state to the folded state is different from a movement track of the second connector in the second track slot in the process in which the electronic device changes from the folded state to the unfolded state. This helps improve design flexibility of the hinge mechanism.

In this disclosure, the movement track of the first connector in the first track slot in the process in which the electronic device changes from the unfolded state to the folded state may be further enabled to be the same as the movement track of the first connector in the first track slot in the process in which the electronic device changes from the folded state to the unfolded state. Further, the surface of the first protrusion may be equidistant from the slot surface of the first arc-shaped slot, and in this case, the first track slot is an equal-width slot. In the processes in which the electronic device changes from the unfolded state to the folded state and from the folded state to the unfolded state, the first arc-shaped surface abuts against the surface of the first protrusion, and the second arc-shaped surface abuts against the slot surface of the first arc-shaped slot. This can help improve movement stability of the first connector in the first track slot. Similarly, the surface of the third protrusion may also be equidistant from the slot surface of the third arc-shaped slot, and in this case, the second track slot is an equal-width slot. In addition, in the processes in which the electronic device changes from the unfolded state to the folded state and from the folded state to the unfolded state, the third arc-shaped surface abuts against the surface of the third protrusion, and the fourth arc-shaped surface abuts against the slot surface of the third arc-shaped slot. In this way, the movement track of the second connector in the second track slot in the process in which the electronic device changes from the unfolded state to the folded state is the same as the movement track of the second connector in the second track slot in the process in which the electronic device changes from the folded state to the unfolded state, to improve movement stability of the second connector in the third track slot.

In a possible implementation of this disclosure, the first arc-shaped surface of the first connector may be a circular arc surface, and the second arc-shaped surface may also be a circular arc surface. In this case, a sum of a radius of the first arc-shaped surface and a radius of the second arc-shaped surface may be equal to a spacing between the surface of the first protrusion and the slot surface of the first arc-shaped slot, to improve smoothness of movement of the first connector in the first track slot.

Similarly, the third arc-shaped surface of the second connector may be a circular arc surface, and the fourth arc-shaped surface may also be a circular arc surface. In this case, a sum of a radius of the third arc-shaped surface and a radius of the fourth arc-shaped surface may be equal to a spacing between the surface of the third protrusion and the slot surface of the third arc-shaped slot, to improve smoothness of movement of the second connector in the second track slot.

In this disclosure, the first swing arm is rotatably connected to the main shaft. The base is provided with a second arc-shaped slot, the first swing arm includes a first arc-shaped rotating block, the first arc-shaped rotating block is accommodated in the second arc-shaped slot, and the first arc-shaped rotating block is capable of sliding along a slot surface of the second arc-shaped slot, for rotatable connection between the first swing arm and the main shaft. Therefore, the first swing arm is rotatably connected to the main shaft in a virtual shaft manner. This helps reduce space occupied by the first swing arm on the main shaft, to help implement a compact design for the hinge mechanism.

In addition, the second swing arm is also rotatably connected to the main shaft. The base is further provided with a fourth arc-shaped slot, the second swing arm includes a second arc-shaped rotating block, the second arc-shaped rotating block is accommodated in the fourth arc-shaped slot, and the second arc-shaped rotating block is capable of sliding along a slot surface of the fourth arc-shaped slot, for rotatable connection between the second swing arm and the main shaft. Therefore, the second swing arm is rotatably connected to the main shaft in a virtual shaft manner. This helps reduce space occupied by the second swing arm on the main shaft, to help implement a compact design for the hinge mechanism.

It may be understood that, for an outward folding electronic device, the first swing arm is rotatably connected to the main shaft via a virtual shaft or a solid shaft, and an axis center at which the first swing arm rotates around the main shaft is located on one side that is of the main shaft and that is away from the flexible display. When the second swing arm is rotatably connected to the main shaft via a virtual shaft or a solid shaft, an axis center at which the second swing arm rotates around the main shaft is located on the side that is of the main shaft and that is away from the flexible display.

To improve reliability of the connection between the first swing arm and the main shaft, in this disclosure, the cover further includes a second protrusion disposed toward the second arc-shaped slot, and at least a part of the first arc-shaped rotating block is located between the second protrusion and the second arc-shaped slot, so that the first swing arm is limited to the main shaft via the second protrusion and the second arc-shaped slot, and the first swing arm may be prevented from falling off from the second arc-shaped slot.

In addition, the cover further includes a fourth protrusion disposed toward the fourth arc-shaped slot, and at least a part of the second arc-shaped rotating block is located between the fourth protrusion and the fourth arc-shaped slot, so that the second swing arm is limited to the main shaft via the fourth protrusion and the fourth arc-shaped slot, and the second swing arm may be prevented from falling off from the fourth arc-shaped slot.

In a possible implementation of this disclosure, the first connector includes a fifth rotating shaft and a sixth rotating shaft, the first connector is rotatably connected to the first swing arm via the first rotating shaft, the first connector is rotatably connected to the first support arm via the fifth rotating shaft, and an axis of the fifth rotating shaft is parallel to and does not coincide with an axis of the sixth rotating shaft, so that the first swing arm and the first support arm can implement mutual pulling movement via the first connector.

The second connector includes a seventh rotating shaft and an eighth rotating shaft, the second connector is rotatably connected to the second swing arm via the seventh rotating shaft, the second connector is rotatably connected to the second support arm via the eighth rotating shaft, and an axis of the seventh rotating shaft is parallel to and does not coincide with an axis of the eighth rotating shaft, so that the second swing arm and the second support arm can implement mutual pulling movement via the second connector.

Further, when the first swing arm is rotatably connected to the first connector via the fifth rotating shaft, the first arc-shaped rotating block may be provided with a first mounting slot, and a slot opening of the first mounting slot is disposed toward the second arc-shaped slot. The fifth rotating shaft is mounted in the first mounting slot, a part of a surface of the fifth rotating shaft is in contact with a slot surface of the first mounting slot, and a part of the surface of the fifth rotating shaft is in contact with the slot surface of the second arc-shaped slot. The fifth rotating shaft is mounted in the first mounting slot of the first arc-shaped rotating block, so that a size of the first arc-shaped rotating block can be effectively reduced, and a thickness of the first mounting slot does not need to be increased due to a size of the first rotating shaft. This helps a compact design for the hinge mechanism.

In addition, the slot surface of the first mounting slot includes a first circular arc surface, the surface that is of the fifth rotating shaft and that is in contact with the slot surface of the first mounting slot is a second circular arc surface, and a center of the first circular arc surface coincides with a center of the second circular arc surface. In this way, the fifth rotating shaft rotates relative to the first arc-shaped rotating block in a process in which the first arc-shaped rotating block slides along the slot surface of the second arc-shaped slot, for rotatable connection between the first swing arm and the fifth rotating shaft.

The slot surface of the second arc-shaped slot is a third circular arc surface, the surface that is of the fifth rotating shaft and that is in contact with the slot surface of the second arc-shaped slot is a fourth circular arc surface, and a center of the third circular arc surface coincides with a center of the fourth circular arc surface. In this way, when the fifth rotating shaft slides along the slot surface of the second arc-shaped slot with the first arc-shaped rotating block, the fifth rotating shaft may further rotate relative to the first arc-shaped rotating block and the second arc-shaped slot, to help implement movement of the first connector relative to the main shaft.

Similarly, the second arc-shaped rotating block is provided with a second mounting slot, a slot opening of the second mounting slot is disposed toward the fourth arc-shaped slot, the seventh rotating shaft is mounted in the second mounting slot, a part of a surface of the seventh rotating shaft is in contact with a slot surface of the second mounting slot, and a part of the surface of the seventh rotating shaft is in contact with the slot surface of the fourth arc-shaped slot. The seventh rotating shaft is mounted in the second mounting slot of the second arc-shaped rotating block, so that a size of the second arc-shaped rotating block can be effectively reduced, and a thickness of the second mounting slot does not need to be increased due to a size of the third rotating shaft. This helps a compact design for the hinge mechanism.

The second mounting slot may include a fifth circular arc surface, the surface that is of the seventh rotating shaft and that is in contact with the slot surface of the second mounting slot is a sixth circular arc surface, and a center of the fifth circular arc surface coincides with a center of the sixth circular arc surface. In addition, the slot surface of the fourth arc-shaped slot is a seventh circular arc surface, and the surface that is of the seventh rotating shaft and that is in contact with the slot surface of the fourth arc-shaped slot may be an eighth circular arc surface. In this case, a center of the seventh circular arc surface coincides with a center of the eighth circular arc surface. In this way, when the seventh rotating shaft slides along the slot surface of the fourth arc-shaped slot with the second arc-shaped rotating block, the seventh rotating shaft may further rotate relative to the second arc-shaped rotating block and the fourth arc-shaped slot, to help implement movement of the second connector relative to the main shaft.

In a possible implementation of this disclosure, the first connector may include a plurality of first sub-connectors that are sequentially rotatably connected. In addition, the plurality of first sub-connectors may be located between the first swing arm and the first support arm, the first swing arm may be rotatably connected to a first sub-connector adjacent to the first swing arm, and the first support arm may be rotatably connected to a first sub-connector adjacent to the first support arm. The first swing arm and the first support arm are connected via the plurality of first sub-connectors. This can effectively improve speed uniformity in a process in which the first swing arm and the first support arm rotate around the main shaft, thereby improving smoothness of mutual pulling movement of the first swing arm and the first support arm.

In addition, the second connector may include a plurality of second sub-connectors that are sequentially rotatably connected. In addition, the plurality of second sub-connectors may be located between the second swing arm and the second support arm, the second swing arm may be rotatably connected to an adjacent second sub-connector, and the second support arm may be rotatably connected to an adjacent second sub-connector. The second swing arm and the second support arm are connected via the plurality of second sub-connectors. This can effectively improve speed uniformity in a process in which the second swing arm and the second support arm rotate around the main shaft, thereby improving smoothness of mutual pulling movement of the second swing arm and the second support arm.

According to a second aspect, this disclosure further provides an electronic device. The electronic device includes a first housing, a second housing, a flexible display, and the hinge mechanism in the first aspect. The first housing and the second housing are respectively disposed on two opposite sides of the hinge mechanism, a first housing mounting bracket is fastened to the first housing, and a second housing mounting bracket is fastened to the second housing. The flexible display continuously covers the first housing, the second housing, and the hinge mechanism, and the flexible display is fastened to the first housing and the second housing. When the electronic device is in an unfolded state, the hinge mechanism, the first housing, and the second housing jointly flatly support the flexible display. This can ensure a complete form of the electronic device in the unfolded state. In a process in which the electronic device changes from the unfolded state to a folded state, the two housings synchronously rotate toward each other to drive the flexible display to rotate, and in a process in which the electronic device changes from the folded state to the unfolded state, the two housings synchronously rotate away from each other to drive the flexible display to rotate. This can effectively avoid deformation of the flexible display, and reduce a risk of damage to the flexible display.

Figure 1:
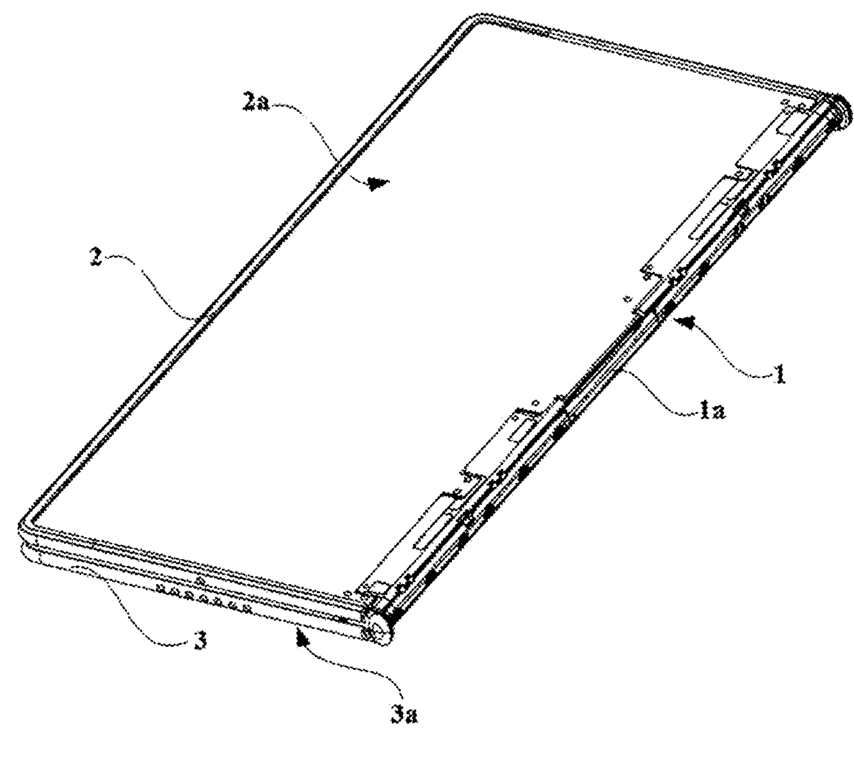
FIG. 1 is a diagram of a structure of an electronic device in a folded state according to an embodiment of this disclosure.

Reference numerals: 1: hinge mechanism; 1*a*: bearing surface; 1*b*: third appearance surface; 101: main shaft; 1011: base; 10111: rotating support member; 101111: first gear surface; 101112: second gear surface; 10112: first arc-shaped slot; 101121: slot surface of the first arc-shaped slot; 10113: second arc-shaped slot; 101131: third circular arc surface; 10114: third arc-shaped slot; 101141: slot surface of the third arc-shaped slot; 10115: fourth arc-shaped slot; 101151: seventh circular arc surface; 1012: cover; 10121: first protrusion; 101211: surface of the first protrusion; 10122: second protrusion; 101221: surface of the second protrusion; 10123: first insertion part; 10124: third protrusion; 101241: surface of the third protrusion; 10125: fourth protrusion; 101251: surface of the fourth protrusion; 1013: first track slot; 1014: second track slot; 102: synchronization assembly; 1021: first gear assembly; 10211: first gear connecting rod; 102111: first gear; 102112: first connecting rod; 10212: third gear connecting rod; 102121: third gear; 102122: third connecting rod; 10213: first rotating shaft; 10214: second rotating shaft; 1022:

second gear assembly; 10221: second gear connecting rod; 102211: second gear; 102212: second connecting rod; 10222: fourth gear connecting rod; 102221: fourth gear; 102222: fourth connecting rod; 10223: third rotating shaft; 10224: fourth rotating shaft; 103: first housing mounting bracket; 1031: first sliding groove; 1032: first mounting part; 1033: third sliding groove; 104: second housing mounting bracket; 1041: second sliding groove; 1042: second mounting part; 1043: fourth sliding groove; 105: rotating module; 1051: first rotating assembly; 10511: first swing arm; 105111: first arc-shaped rotating block; 1051111: first recess; 1051112: first mounting slot; 10511121: first circular arc surface; 10512: first support arm; 10513: first connector; 105131: fifth rotating shaft; 1051311: second circular arc surface; 1051312: fourth circular arc surface; 105132: sixth rotating shaft; 105133: first arc-shaped surface; 105134: second arc-shaped surface; 1052: second rotating assembly; 10521: second swing arm; 105211: second arc-shaped rotating block; 1052111: second recess; 1052112: second mounting slot; 10521121: fifth circular arc surface; 10522: second support arm; 10523: second connector; 105231: seventh rotating shaft; 1052311: sixth circular arc surface; 1052312: eighth circular arc surface; 105232: eighth rotating shaft; 105233: third arc-shaped surface; 105234: fourth arc-shaped surface; 2: first housing; 2*a*: first support surface; 2*b*: first appearance surface; and 3: second housing; 3*a*: second support surface; 3*b*: second appearance surface; 4: flexible display; 5: display accommodation space.

DESCRIPTION OF EMBODIMENTS

To make the objectives, technical solutions, and advantages of this disclosure clearer, the following further describes this disclosure in detail with reference to the accompanying drawings. Terms used in the following embodiments of this disclosure are merely intended to describe specific embodiments, but are not intended to limit this disclosure. The terms "one", "a" and "this" of singular forms used in this specification and the appended claims of this disclosure are also intended to include expressions such as "one or more", unless otherwise specified in the context clearly.

Reference to "an embodiment", "some embodiments", or the like described in this specification indicates that one or more embodiments of this disclosure include a specific feature, structure, or characteristic described with reference to embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise emphasized in another manner. The terms "include", "have", and their variants all mean "include but are not limited to", unless otherwise emphasized in another manner.

For ease of understanding a hinge mechanism provided in embodiments of this disclosure, the following first describes an application scenario of the hinge mechanism. Use of the hinge mechanism may be in, but is not limited to, a foldable electronic device like a mobile phone, a palmtop computer (e.g., personal digital assistant (PDA)), a notebook computer, or a tablet computer. In this disclosure, the electronic device may be an outward folding electronic device, or may be an inward folding electronic device. In a process in which the outward folding electronic device changes from an unfolded state to a folded state, a flexible display is always located on an outer side of the electronic device. When the inward folding electronic device is in a folded state, a flexible display is located on an inner side of the electronic device. In embodiments of this disclosure, application of the hinge mechanism in the electronic device is described by using the outward folding electronic device as an example. FIG. 1 is a diagram of a structure of an electronic device in a folded state according to an embodiment of this disclosure. In addition to a hinge mechanism 1, the electronic device may further include two housings and a flexible display. For ease of description, the two housings may be respectively named a first housing 2 and a second housing 3. The first housing 2 and the second housing 3 are located on two sides of the hinge mechanism 1, and can rotate around the hinge mechanism 1. When the electronic device is used, the electronic device may be folded or unfolded in different use scenarios.

FIG. 1 shows a relative position relationship between the hinge mechanism 1 and the two housings when the electronic device is in a folded state. In this case, a first surface of the hinge mechanism 1, a first surface of the first housing, and a first surface of the second housing may be jointly used as a support surface of the flexible display. The flexible display is omitted in FIG. 1. The first surface of the hinge mechanism 1 is a surface that is of the hinge mechanism 1 and that faces the flexible display. The first surface of the first housing 2 is a surface that is of the first housing 2 and that faces the flexible display. The first surface of the second housing 3 is a surface that is of the second housing 3 and that faces the flexible display. For ease of description, in this disclosure, the first surface of the hinge mechanism 1 may be defined as a bearing surface 1*a* of the hinge mechanism 1, the first surface of the first housing 2 may be defined as a first support surface 2*a*, and the first surface of the second housing 3 may be defined as a second support surface 3*a*.

Figure 2A:
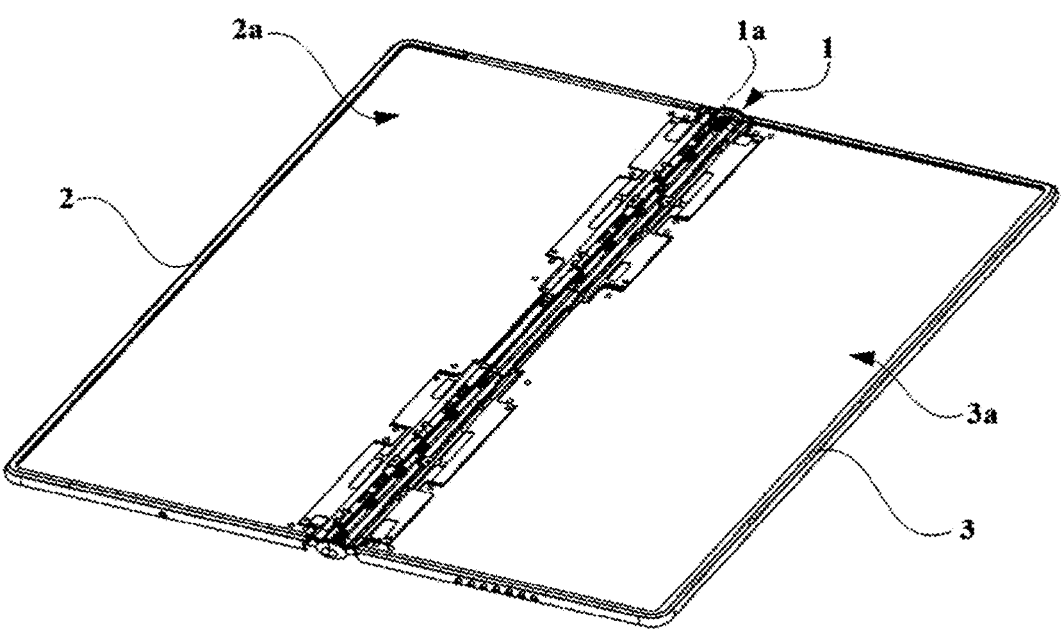
FIG. 2A is a diagram of a structure of an electronic device in an unfolded state according to an embodiment of this disclosure.

FIG. 2A is a diagram of a structure of an electronic device in an unfolded state, and FIG. 2A shows a structure of the first support surface 2*a* of the first housing 2 and a structure of the second support surface 3*a* of the second housing 3. In the unfolded state, the bearing surface 1*a* of the hinge mechanism 1, the first support surface 2*a* of the first housing 2, and the second support surface 3*a* of the second housing 3 may be connected to form a flat support surface.

In view of this, the flexible display may continuously cover the bearing surface 1*a* of the hinge mechanism 1, the first support surface 2*a* of the first housing 2, and the second support surface 3*a* of the second housing 3. The hinge mechanism 1 is disposed corresponding to a bendable part of the flexible display, and the flexible display may be fixedly connected to the first support surface 2*a* of the first housing 2 and the second support surface 3*a* of the second housing 3. A connection manner of the flexible display may be but is not limited to bonding. In this way, when the electronic device is in the unfolded state shown in FIG. 2A, the hinge mechanism 1, the first housing 2, and the second housing 3 may flatly support the flexible display.

Figure 2B:
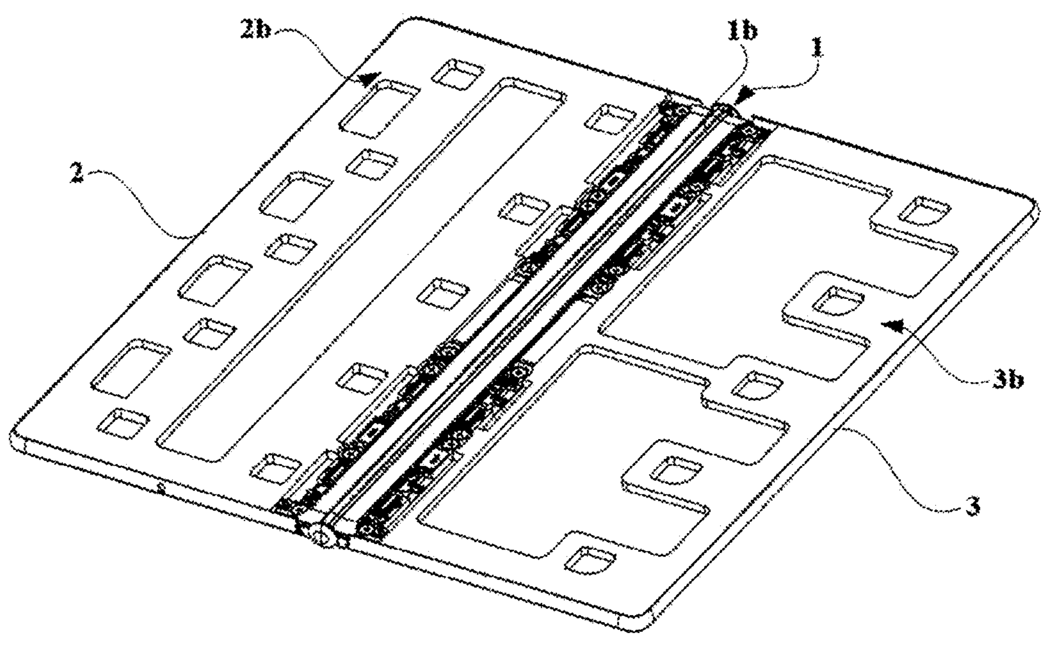
FIG. 2B is a diagram of another structure of an electronic device in an unfolded state according to an embodiment of this disclosure.

In addition, FIG. 2B is a diagram of another structure of an electronic device in an unfolded state according to an embodiment of this disclosure. FIG. 2B shows structures of a second surface of the hinge mechanism 1, a second surface of the first housing 2, and a second surface of the second housing 3. The second surface of the hinge mechanism 1 is a surface that is of the hinge mechanism 1 and that is away from the flexible display, the second surface of the first housing 2 is a surface that is of the first housing 2 and that is away from the flexible display, and the second surface of the second housing 3 is a surface that is of the second housing 3 and that is away from the flexible display. In this case, the first surface and the second surface of the hinge mechanism 1 are disposed opposite to each other, the first surface and the second surface of the first housing 2 are disposed opposite to each other, and the first surface and the second surface of the second housing 3 are disposed opposite to each other. In this disclosure, the second surface of the hinge mechanism 1, the second surface of the first housing 2, and the second surface of the second housing 3 may be used as an appearance surface of the electronic device. For ease of description, the second surface of the first housing 2 may be defined as a first appearance surface 2*b*, the second surface of the second housing 3 may be defined as a second appearance surface 3*b*, and the second surface of the hinge mechanism 1 may be defined as a third appearance surface 1*b*. It may be understood that, for the outward folding electronic device, the appearance surface of the electronic device is exposed outside the electronic device when the electronic device is in the unfolded state, and the appearance surface of the electronic device is located inside the electronic device when the electronic device is in the folded state. In this disclosure, in a process in which the first housing 2 and the second housing 3 relatively rotate from the unfolded state shown in FIG. 2A or FIG. 2B to the folded state shown in FIG. 1 or from the folded state shown in FIG. 1 to the unfolded state shown in FIG. 2A or FIG. 2B, the flexible display may be bent or flattened with the first housing 2 and the second housing 3. In addition, it may be understood that a process in which the electronic device changes from the unfolded state shown in FIG. 2A or FIG. 2B to the folded state shown in FIG. 1 or from the folded state shown in FIG. 1 to the unfolded state shown in FIG. 2A or FIG. 2B is a process in which the first housing 2 and the second housing 3 rotate around the hinge mechanism 1.

The hinge mechanism 1 as a key functional component in the foldable electronic device may be disposed corresponding to a foldable part of the flexible display. In the process in which the first housing 2 and the second housing 3 of the electronic device rotate around the hinge mechanism 1, if forces applied by the first housing 2 and the second housing 3 to the flexible display are not synchronous, stress on the flexible display is likely to be nonuniform. Consequently, the flexible display is squeezed or pulled, or even the flexible display is damaged.

In view of this, a synchronization assembly is disposed in the hinge mechanism provided in this disclosure, to help the first housing and the second housing of the electronic device synchronously move toward each other or away from each other around the hinge mechanism, so that a part that is of the flexible display and that is connected to the first housing and a part that is of the flexible display and that is connected to the second housing can synchronously move toward each other or away from each other. This can improve uniformity of the stress on the flexible display, and effectively reduce a risk that the flexible display is squeezed or pulled, to prolong a service life of the flexible display, and further improve structural reliability of the electronic device. To facilitate understanding of the hinge mechanism provided in embodiments of this disclosure, the following describes a specific structure of the hinge mechanism in detail with reference to the accompanying drawings.

Figure 3:
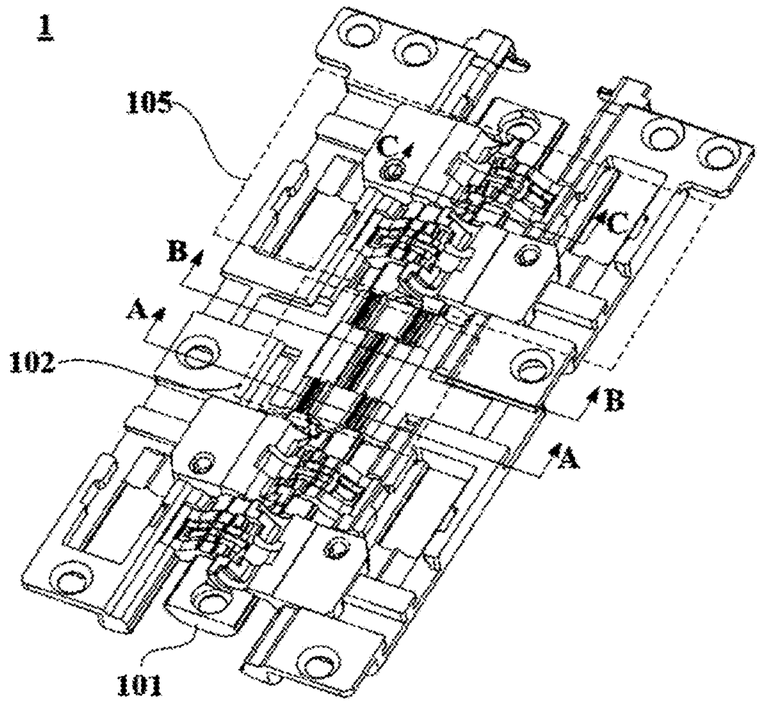
FIG. 3 is a diagram of a structure of a hinge mechanism according to an embodiment of this disclosure.

FIG. 3 is a diagram of a structure of the hinge mechanism 1 according to an embodiment of this disclosure. In this disclosure, the hinge mechanism 1 may include a main shaft 101 and a synchronization assembly 102. A quantity of synchronization assemblies 102 in the hinge mechanism 1 is not limited in this disclosure. The hinge mechanism 1 may include only one synchronization assembly 102, or may include a plurality of synchronization assemblies 102. When the hinge mechanism 1 includes a plurality of synchronization assemblies 102, the plurality of synchronization assemblies 102 may be arranged at spacings along a length direction of the hinge mechanism 1. In this disclosure, the length direction of the hinge mechanism 1 is an extension direction of an axis along which the first housing and the second housing rotate around the hinge mechanism 1 shown in FIG. 2B.

Figure 4:
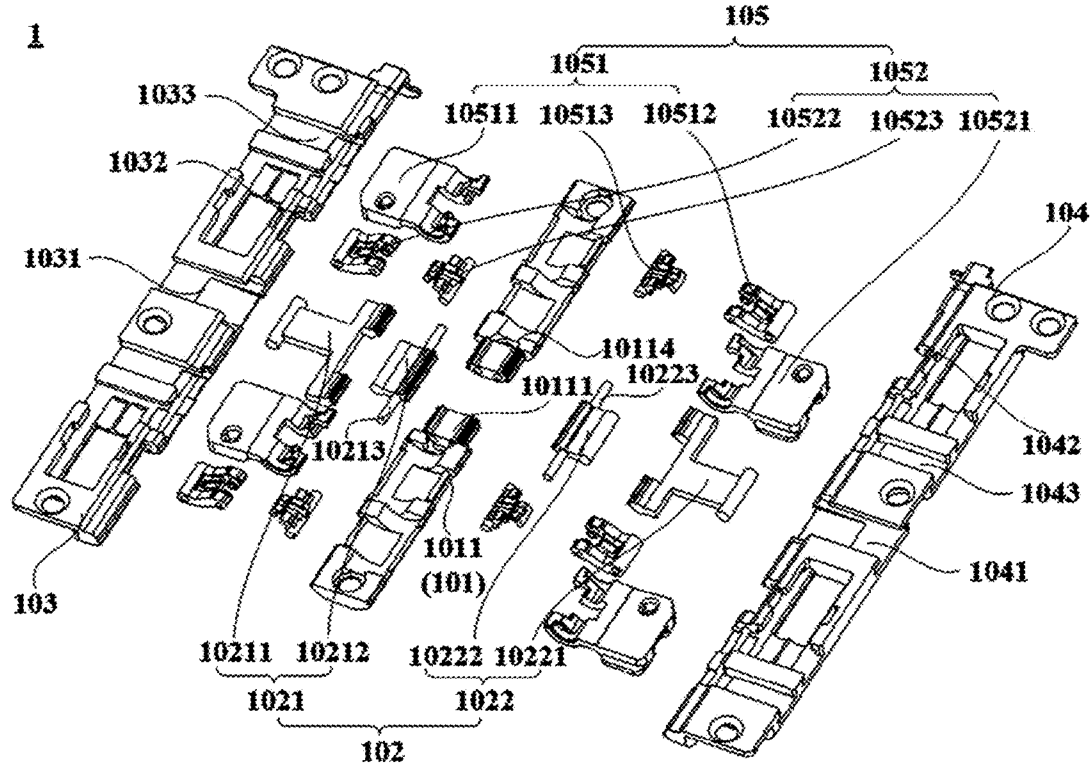
FIG. 4 is an exploded view of the hinge mechanism shown in FIG. 3.

In this disclosure, refer to FIG. 4 about how to set the synchronization assembly 102. FIG. 4 is an exploded view of the hinge mechanism 1 shown in FIG. 3. The synchronization assembly 102 may include a first gear assembly 1021 and a second gear assembly 1022. The first gear assembly 1021 and the second gear assembly 1022 are respectively located on two opposite sides of the main shaft 101, and the first gear assembly 1021 and the second gear assembly 1022 are rotatably connected to the main shaft 101. During specific implementation, the first gear assembly 1021 includes a first gear connecting rod 10211 and a third gear connecting rod 10212. The first gear connecting rod 10211 is rotatably connected to the third gear connecting rod 10212. The second gear assembly 1022 includes a second gear connecting rod 10221 and a fourth gear connecting rod 10222. The second gear connecting rod 10221 is rotatably connected to the fourth gear connecting rod 10222.

Figure 5:
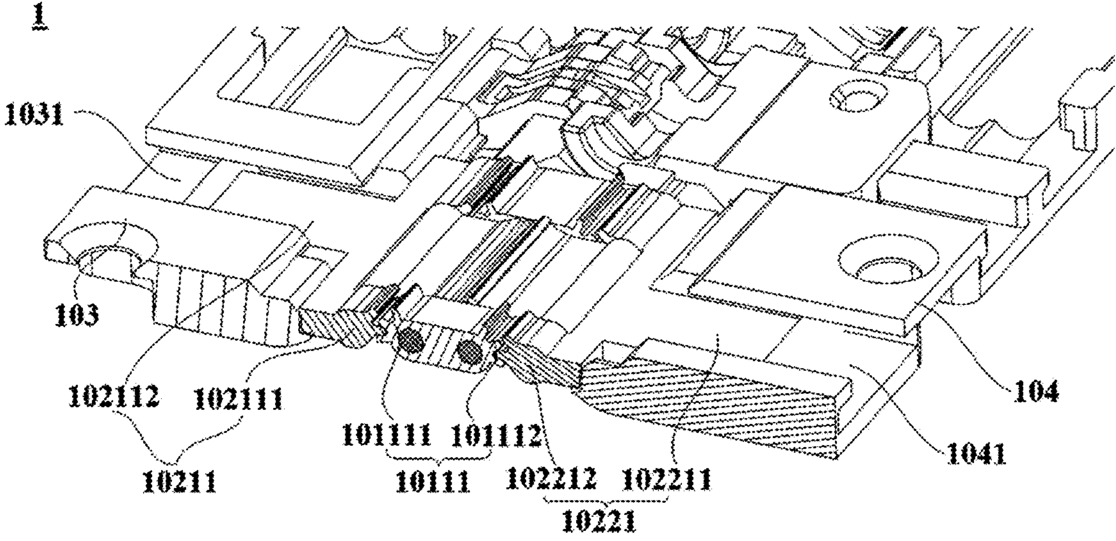
FIG. 5 is an A-A sectional view of the hinge mechanism shown in FIG. 3.

In addition, refer to FIG. 5. FIG. 5 is an A-A sectional view of the hinge mechanism 1 shown in FIG. 3, and may be used to show a rotatable connection manner between the first gear connecting rod 10211 and the main shaft 101 and a rotatable connection manner between the second gear connecting rod 10221 and the main shaft 101 when the electronic device is in the unfolded state. The first gear connecting rod 10211 includes a first gear 102111 and a first connecting rod 102112, and the second gear connecting rod 10221 includes a second gear 102211 and a second connecting rod 102212. In addition, the main shaft 101 is provided with a rotating support member 10111, and the first gear connecting rod 10211 and the second gear connecting rod 10221 are respectively disposed on two opposite sides of the rotating support member 10111. A first gear surface 101111 is disposed at an end part that is of the rotating support member 10111 and that faces the first gear 102111, and a second gear surface 101112 is disposed at an end part that is of the rotating support member 10111 and that faces the second gear 102211. A gear surface of the first gear 102111 is engaged with the first gear surface 101111, and a gear surface of the second gear 102211 is engaged with the second gear surface 101112.

Refer to FIG. 4 and FIG. 5 together. In this disclosure, the main shaft 101 may include a base 1011, the rotating support member 10111 may be disposed on the base 1011, and the rotating support member 10111 is fastened to the base 1011. The rotating support member 10111 and the base 1011 may be an integrated structure, and the rotating support member 10111 may be a part of the base 1011, so that structural reliability of the main shaft 101 can be improved, and a size of the main shaft 101 can be reduced. In some other possible embodiments of this disclosure, the rotating support member 10111 and the base 1011 may alternatively be two independent structures, and the two may be fastened to each other in a manner of welding, riveting, threaded connection, or the like, so that a position of the rotating support member 10111 on the base 1011 is relatively flexible.

Figure 6:
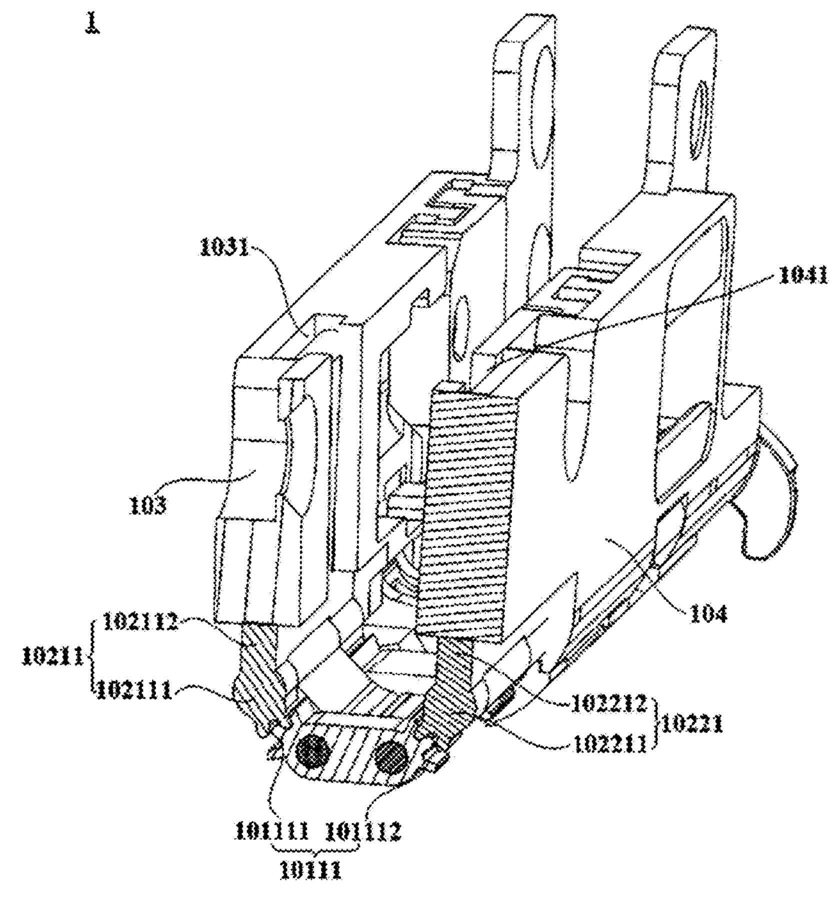
FIG. 6 is a diagram of a structure of the hinge mechanism shown in FIG. 5 when an electronic device is in a folded state.

FIG. 6 is a diagram of a structure of the hinge mechanism 1 shown in FIG. 5 when the electronic device is in the folded state. In the process in which the electronic device changes from the unfolded state to the folded state, the first gear 102111 may rotate around the rotating support member 10111 clockwise, and the second gear 102211 may rotate around the rotating support member 10111 counter-clockwise. In addition, in the process in which the electronic device changes from the folded state to the unfolded state, a movement direction of each structure is opposite to a movement direction of each structure in the process in which the electronic device changes from the unfolded state to the folded state. Details are not described herein.

Figure 7:
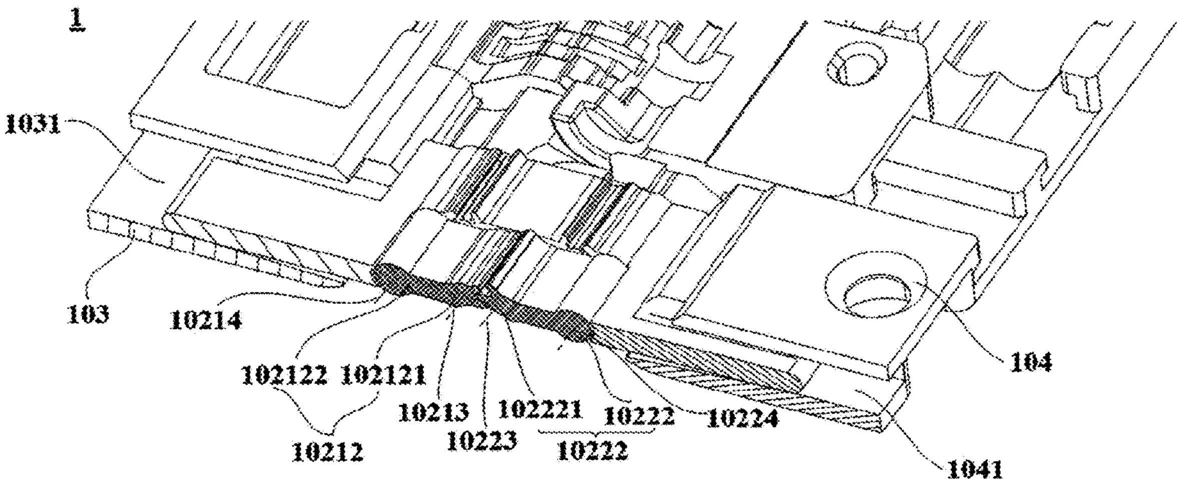
FIG. 7 is a B-B sectional view of the hinge mechanism shown in FIG. 3.

FIG. 7 is a B-B sectional view of the hinge mechanism 1 shown in FIG. 3, and may be used to show a transmission connection relationship between the third gear connecting rod 10212 and the fourth gear connecting rod 10222. The third gear connecting rod 10212 includes a third gear 102121 and a third connecting rod 102122, and the third gear 102121 is rotatably connected to the main shaft 101. Refer to FIG. 4 and FIG. 7 together. The third gear 102121 may be rotatably connected to the rotating support member 10111 via a first rotating shaft 10213, so that the first rotating shaft 10213 may penetrate both the third gear 102121 and the rotating support member 10111 at the same time. In addition, the third connecting rod 102122 may be rotatably connected to the first gear connecting rod 10211. During specific implementation, the third connecting rod 102122 may be rotatably connected to the first gear 102111 via a second rotating shaft 10214, so that the second rotating shaft 10214 may penetrate both the third connecting rod 102122 and the first gear 102111 at the same time. It may be understood that an axis of the second rotating shaft 10214 coincides with an axis of the first gear 102111, and an axis of the first rotating shaft 10213 is parallel to and does not coincide with the axis of the second rotating shaft 10214.

Still refer to FIG. 4. In this disclosure, the first gear connecting rod 10211 may include two first gears 102111, and the two first gears 102111 are disposed at a spacing along a length direction of the hinge mechanism 1. A rotating support member 10111 may be disposed on the main shaft 101 corresponding to each first gear 102111, so that each first gear 102111 is rotatably connected to the corresponding rotating support member 10111 via gear surfaces that are engaged with each other. This helps improve stability of rotation of the first gear connecting rod 10211 around the main shaft 101, to improve stability of the rotatable connection between the first gear assembly 1021 and the main shaft 101. In addition, the third gear connecting rod 10212 may be disposed between the two first gears 102111, so that a structure of the first gear assembly 1021 is relatively compact, to help a compact design for the hinge mechanism 1.

Still refer to FIG. 7. The fourth gear connecting rod 10222 includes a fourth gear 102221 and a fourth connecting rod 102222, and a gear surface of the fourth gear 102221 is engaged with a gear surface of the third gear 102121. In this disclosure, the fourth gear 102221 is rotatably connected to the main shaft 101. For example, as shown in FIG. 4 and FIG. 7, the fourth gear 102221 may be rotatably connected to the rotating support member 10111 via a third rotating shaft 10223, so that the third rotating shaft 10223 may penetrate both the fourth gear 102221 and the rotating support member 10111 at the same time. In addition, the fourth connecting rod 102222 may be rotatably connected to the second gear connecting rod 10221 via a fourth rotating shaft 10224, and the fourth rotating shaft 10224 may penetrate both the fourth connecting rod 102222 and the second gear 102211 at the same time. In addition, an axis of the fourth rotating shaft 10224 coincides with an axis of the second gear 102211. It should be noted that, in this disclosure, an axis of the third rotating shaft 10223 is parallel to and does not coincide with the axis of the fourth rotating shaft 10224.

Still refer to FIG. 4. In this disclosure, the second gear connecting rod 10221 may include two second gears 102211, and the two second gears 102211 are disposed at a spacing along the length direction of the hinge mechanism 1. A rotating support member 10111 may be disposed on the main shaft 101 corresponding to each second gear 102211, so that each second gear 102211 is rotatably connected to the corresponding rotating support member 10111 via gear surfaces that are engaged with each other. This helps improve stability of rotation of the second gear connecting rod 10221 around the main shaft 101, to improve stability of the rotatable connection between the second gear assembly 1022 and the main shaft 101. In addition, the fourth gear connecting rod 10222 may be disposed between the two second gears 102211, so that a structure of the second gear assembly 1022 is relatively compact, to help a compact design for the hinge mechanism 1.

Figure 8:
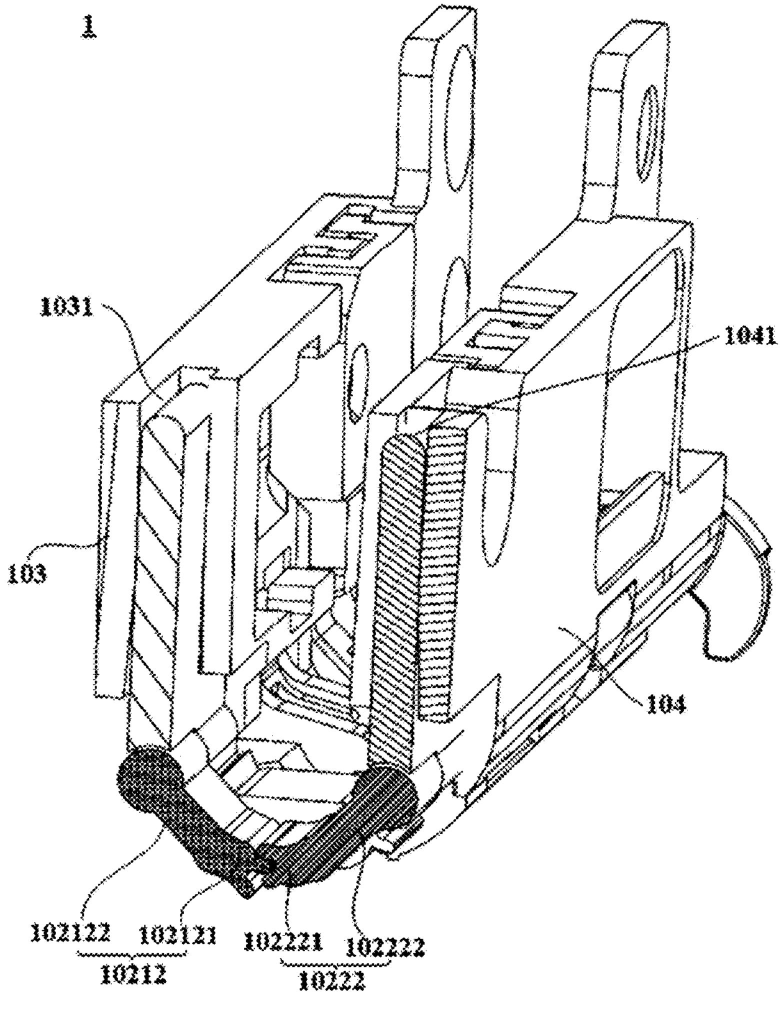
FIG. 8 is a diagram of a structure of the hinge mechanism shown in FIG. 7 when an electronic device is in a folded state.

FIG. 8 is a diagram of a structure of the hinge mechanism 1 shown in FIG. 7 when the electronic device is in the folded state. Refer to FIG. 7 and FIG. 8 together. In the process in which the electronic device changes from the unfolded state to the folded state, the third gear 102121 may rotate around the main shaft 101 clockwise. Because the gear surfaces of the third gear 102121 and the fourth gear 102221 are engaged with each other, the third gear 102121 rotates around the main shaft 101 clockwise to drive the fourth gear 102221 to synchronously rotate counter-clockwise toward the third gear, so that the third gear connecting rod 10212 and the fourth gear connecting rod 10222 synchronously rotate toward each other. In addition, in the process in which the electronic device changes from the folded state to the unfolded state, a movement direction of each structure is opposite to a movement direction of each structure in the process in which the electronic device changes from the unfolded state to the folded state. Details are not described herein. In this case, the third gear connecting rod 10212 and the fourth gear connecting rod 10222 synchronously rotate away from each other.

Based on the foregoing descriptions of the structure of the synchronization assembly 102 provided in embodiments of this disclosure, in the process in which the electronic device changes from the unfolded state to the folded state, the first gear connecting rod 10211 rotates around the main shaft 101 clockwise to drive the third gear connecting rod 10212 to rotate along a same direction. In addition, because the third gear connecting rod 10212 is engaged with the fourth gear connecting rod 10222 via gears, the third gear connecting rod 10212 rotates clockwise to drive the fourth gear connecting rod 10222 to synchronously rotate counter-clockwise, the fourth gear connecting rod 10222 may drive the second gear connecting rod 10221 to rotate along the same direction, so that the first gear assembly 1021 and the second gear assembly 1022 synchronously rotate toward each other. In addition, in the process in which the electronic device changes from the folded state to the unfolded state, a movement direction of each structure is opposite to a movement direction of each structure in the process in which the electronic device changes from the unfolded state to the folded state. Details are not described herein. In this case, the first gear assembly 1021 and the second gear assembly 1022 synchronously rotate away from each other.

In the hinge mechanism 1 provided in embodiments of this disclosure, because synchronous rotation of the first gear assembly 1021 and the second gear assembly 1022 of the synchronization assembly 102 is implemented by using two levels of gear surfaces that are engaged with each other, high-precision gear transmission can be implemented. In addition, by using the structure design, when the first gear assembly 1021 and the second gear assembly 1022 are rotatably connected to the main shaft 101, the main shaft 101 may perform less avoidance for the two gear assemblies, so that a structure of the main shaft 101 is relatively complete and the strength of the main shaft 101 is relatively good, to help improve structural reliability of the entire hinge mechanism 1.

Still refer to FIG. 4 and FIG. 5. In this disclosure, the hinge mechanism 1 may further include a first housing mounting bracket 103 and a second housing mounting bracket 104. The first housing mounting bracket 103 and the second housing mounting bracket 104 are respectively disposed on two opposite sides of the main shaft 101, and the synchronization assembly 102 is located between the first housing mounting bracket 103 and the second housing mounting bracket 104. The first gear connecting rod 10211 and the first housing mounting bracket 103 are located on a same side of the main shaft 101, and the first connecting rod 102112 of the first gear connecting rod 10211 is slidably connected to the first housing mounting bracket 103. During specific implementation, the first housing mounting bracket 103 is provided with a first sliding groove 1031, and the first sliding groove 1031 has an opening disposed toward the main shaft 101. The first connecting rod 102112 may be mounted in the first sliding groove 1031, and in the process in which the electronic device changes from the unfolded state to the folded state or from the folded state to the unfolded state, the first connecting rod 102112 is capable of sliding in the first sliding groove 1031 relative to the first housing mounting bracket 103 toward or away from the main shaft 101, so that the slidable connection between the first gear connecting rod 10211 and the first housing mounting bracket 103 is implemented through the slidable connection between the first connecting rod 102112 and the first housing mounting bracket 103. In this disclosure, a specific disposing form of the first sliding groove 1031 is not limited. For example, the first sliding groove 1031 may be a straight line sliding groove. In this case, the first connecting rod 102112 may be provided with a straight line sliding block structure, which can effectively simplify a connection structure between the first connecting rod 102112 and the first housing mounting bracket 103, and improve smoothness of sliding of the first connecting rod 102112 relative to the first housing mounting bracket 103.

In addition, the second gear connecting rod 10221 and the second housing mounting bracket 104 are located on a same side of the main shaft 101, and the second connecting rod 102212 of the second gear connecting rod 10221 is slidably connected to the second housing mounting bracket 104. During specific implementation, the second housing mounting bracket 104 is provided with a second sliding groove 1041, the second connecting rod 102212 may be mounted in the second sliding groove 1041, and in the process in which the electronic device changes from the unfolded state to the folded state or from the folded state to the unfolded state, the second connecting rod 102212 is capable of sliding in the second sliding groove 1041 relative to the second housing mounting bracket 104 toward or away from the base 1011. In this disclosure, a specific disposing form of the second sliding groove 1041 is not limited. For example, the second sliding groove 1041 may be a straight line sliding groove. In this case, the second sliding block may be provided with a straight line sliding block structure, which can effectively simplify a connection structure between the second connecting rod 102212 and the second housing mounting bracket 104, and improve smoothness of sliding of the second connecting rod 102212 relative to the second housing mounting bracket 104.

In the rotating mechanism provided in embodiments of this disclosure, in the process in which the electronic device changes from the unfolded state to the folded state, the first housing mounting bracket 103 rotates clockwise relative to the main shaft 101 to drive the first gear connecting rod 10211 to rotate around the main shaft 101 clockwise, and the first gear connecting rod 10211 may drive the third gear connecting rod 10212 to rotate along a same direction. In addition, because the third gear connecting rod 10212 and the fourth gear connecting rod 10222 are engaged via gears, the third gear connecting rod 10212 rotates clockwise to drive the fourth gear connecting rod 10222 to rotate synchronously counter-clockwise, and the fourth gear connecting rod 10222 may drive the second gear connecting rod 10221 to rotate along a same direction, so that the second gear connecting rod 10221 slides relative to the second housing mounting bracket 104 to drive the second housing mounting bracket 104 to rotate counter-clockwise along a same direction. In this way, the first housing mounting bracket 103 and the second housing mounting bracket 104 synchronously rotate toward each other. In addition, in the process in which the electronic device changes from the folded state to the unfolded state, a movement direction of each structure is opposite to a movement direction of each structure in the foregoing process in which the electronic device changes from the unfolded state to the folded state. Details are not described herein. In this case, the first housing mounting bracket 103 and the second housing mounting bracket 104 synchronously move away from each other.

The hinge mechanism 1 provided in the foregoing embodiments of this disclosure may be used in, for example, the outward folding electronic device shown in FIG. 1 or FIG. 2A. The first housing mounting bracket 103 may be fastened to a housing located on a same side of the main shaft 101, and the second housing mounting bracket 104 may be fastened to another housing. For example, the first housing mounting bracket 103 may be configured to be fastened to the first housing 2 of the electronic device shown in FIG. 2A, and the second housing mounting bracket 104 may be configured to be fastened to the second housing 3 of the electronic device shown in FIG. 2A. In view of this, it may be understood that, a process in which the first housing mounting bracket 103 and the second housing mounting bracket 104 synchronously rotate toward each other or away from each other is a process in which the first housing 2 and the second housing 3 synchronously rotate toward each other or away from each other.

In addition, the flexible display of the electronic device may be fastened to the first housing 2 and the second housing 3, and a connection manner may be but is not limited to bonding. During specific implementation, the flexible display may be bonded to a part of the first support surface 2*a* of the first housing 2, and the flexible display may be bonded to a part of the second support surface 3*a* of the second housing 3. In this way, when the electronic device is in the unfolded state, the bearing surface 1*a* of the hinge mechanism 1, the first support surface 2*a* of the first housing 2, and the second support surface 3*a* of the second housing 3 may jointly flatly support the flexible display. Therefore, it can be ensured that a form of the electronic device in the unfolded state is complete. In the process in which the electronic device changes from the unfolded state to the folded state, synchronous rotation of the two housings may drive synchronous rotation of parts that are of the flexible display and that are fastened to the two housings, so that the stress on the flexible display is relatively uniform, to effectively avoid deformation of the flexible display, and reduce a risk of damage to the flexible display.

In this disclosure, to implement a rotation function of the hinge mechanism 1, the hinge mechanism 1 may further include a rotating module 105. A quantity of rotating modules 105 in the hinge mechanism 1 is not limited in this disclosure. The hinge mechanism 1 may include only one rotating module 105, or may include a plurality of rotating modules 105. Still refer to FIG. 3. When the hinge mechanism 1 includes a plurality of rotating modules 105, the plurality of rotating modules 105 may be arranged at spacings along a length direction of the hinge mechanism 1.

For ease of understanding a structure of the rotating module 105, still refer to FIG. 4. The rotating module 105 may include a first rotating assembly 1051 and a second rotating assembly 1052, where the first rotating assembly 1051 is located between the first housing mounting bracket 103 and the second housing mounting bracket 104, and the second rotating assembly 1052 is located between the first housing mounting bracket 103 and the second housing mounting bracket 104. In addition, as shown in FIG. 4, the main shaft 101 of the hinge mechanism 1 may be used as a bearing component of the first rotating assembly 1051 and the second rotating assembly 1052.

It should be noted that, in embodiments of this disclosure, when there is a plurality of rotating modules 105, first rotating assemblies 1051 and second rotating assemblies 1052 of the plurality of rotating modules 105 may all use the same main shaft 101 as the bearing component, to improve an integration degree of the hinge mechanism 1. In some other possible embodiments of this disclosure, one main shaft 101 may be correspondingly disposed for each rotating module 105 in the hinge mechanism 1, so that a corresponding main shaft 101 is used as a bearing component for a first rotating assembly 1051 and a second rotating assembly 1052 of each rotating module 105.

Still refer to FIG. 4. The first rotating assembly 1051 may include a first swing arm 10511, a first support arm 10512, and a first connector 10513. The first connector 10513 is located between the first swing arm 10511 and the first support arm 10512, the first connector 10513 is rotatably connected to the first swing arm 10511, and the first connector 10513 is rotatably connected to the first support arm 10512, so that the first swing arm 10511 and the first support arm 10512 perform mutual pulling movement via the first connector 10513. In view of this, it may be understood that a movement track of the first connector 10513 plays a key role in a movement track of the first rotating assembly 1051.

Figure 9:
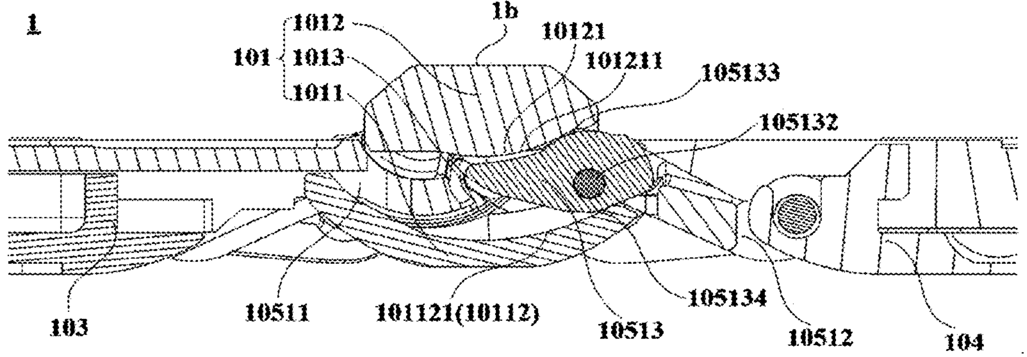
FIG. 9 is a sectional view of a first connector of a hinge mechanism when an electronic device is in an unfolded state according to an embodiment of this disclosure.

In this disclosure, the first connector 10513 is capable of moving relative to the main shaft 101. In practice, refer to FIG. 9. FIG. 9 is a sectional view of the first connector 10513 of the hinge mechanism 1 when the electronic device is in the unfolded state according to an embodiment of this disclosure. The main shaft 101 may be provided with a first track slot 1013, and the first connector 10513 is capable of moving along the first track slot 1013, for limitation on a movement track of the first connector 10513.

Figure 10:
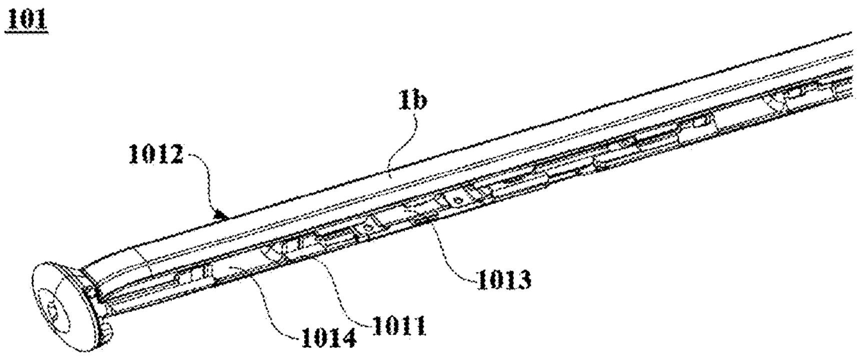
FIG. 10 is a diagram of a structure of a main shaft according to an embodiment of this disclosure.
Figure 11:
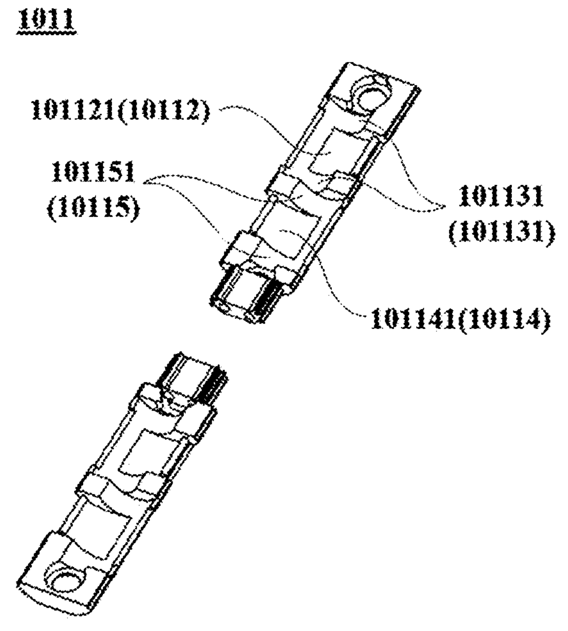
FIG. 11 is a diagram of a structure of a base of the main shaft shown in FIG. 10.
Figure 12:
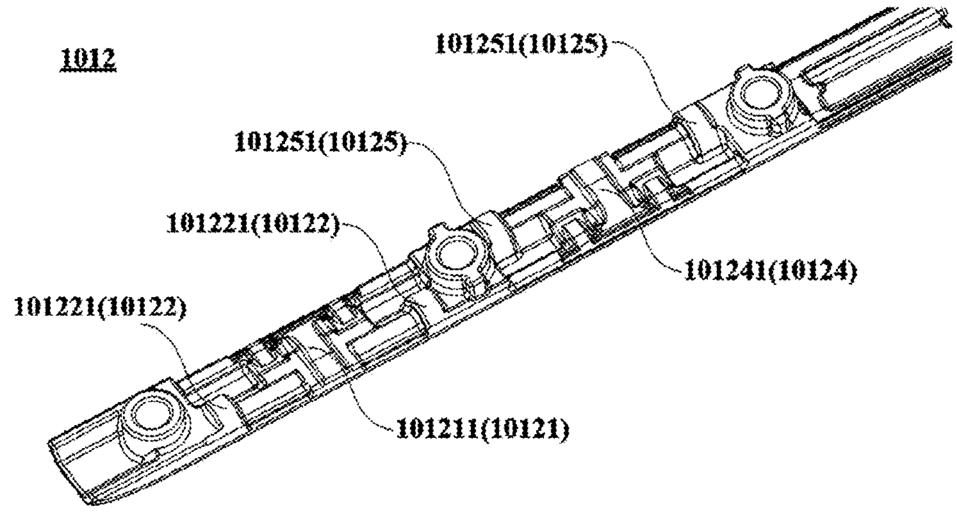
FIG. 12 is a diagram of a structure of a cover of the main shaft shown in FIG. 10.

FIG. 10 is a diagram of a structure of the main shaft 101 according to an embodiment of this disclosure. The main shaft 101 may further include a cover 1012. The cover 1012 covers the base 1011, and an outer surface of the cover 1012 may be used as the third appearance surface 1*b* of the hinge mechanism 1. FIG. 11 is a diagram of a structure of the base 1011 of the main shaft 101 shown in FIG. 10. The base 1011 may be provided with a first arc-shaped slot 10112. Refer to FIG. 9 and FIG. 11 together. The first connector 10513 is accommodated in the first arc-shaped slot 10112, and the first connector 10513 is capable of sliding along a slot surface 101121 of the first arc-shaped slot. In addition, refer to FIG. 12. FIG. 12 is a diagram of a structure of the cover 1012 of the main shaft 101 shown in FIG. 10. FIG. 12 is used to show a structure of a side that is of the cover 1012 and that faces the base 1011. The cover 1012 includes a first protrusion 10121. As shown in FIG. 9, the first protrusion 10121 may be disposed toward the first arc-shaped slot 10112. A gap exists between a surface 101211 of the first protrusion and the slot surface 101121 of the first arc-shaped slot, and the gap is used as the first track slot 1013.

Figure 13:
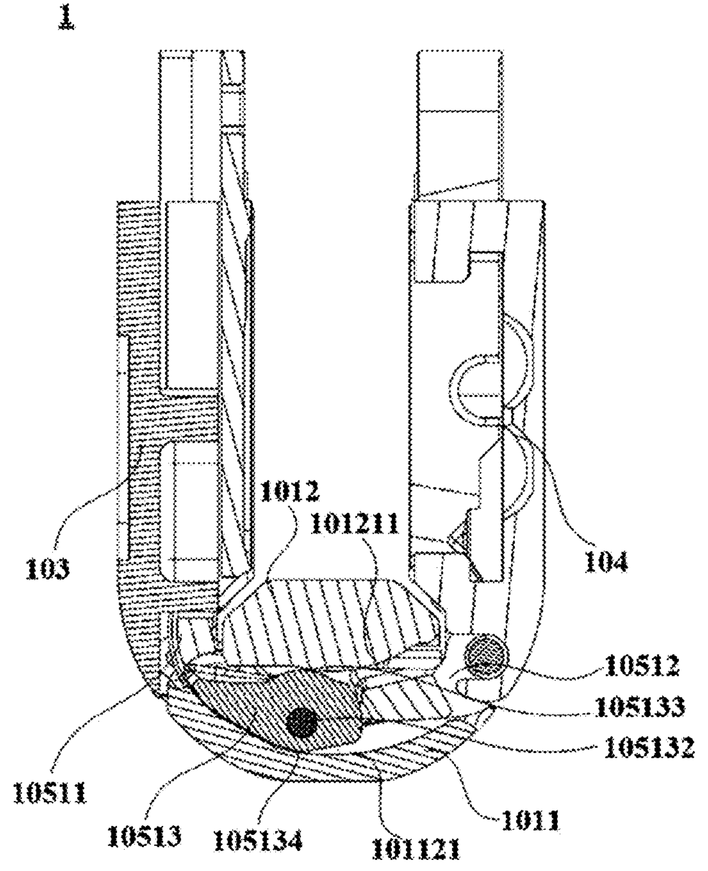
FIG. 13 is a sectional view of a first connector of a hinge mechanism when an electronic device is in a folded state according to an embodiment of this disclosure.

FIG. 13 is a sectional view of the first connector 10513 of the hinge mechanism 1 when the electronic device is in the folded state according to an embodiment of this disclosure. Refer to FIG. 9 and FIG. 13 together. In the process in which the electronic device changes from the unfolded state to the folded state, the first connector 10513 is capable of moving toward the first swing arm 10511 in the first track slot 1013. In the process in which the electronic device changes from the folded state to the unfolded state, the first connector 10513 is capable of moving toward the first support arm 10512 in the first track slot 1013. In this way, the first connector 10513 is capable of moving relative to the main shaft 101 according to a specified track.

Refer to FIG. 9 and FIG. 13 together. It can be seen that, in the process in which the electronic device changes from the unfolded state to the folded state or from the folded state to the unfolded state, the first swing arm 10511 and the first support arm 10512 can rotate around the main shaft 101. In addition, because the first swing arm 10511 and the first support arm 10512 perform mutual pulling movement via the first connector 10513, the first connector 10513 can further rotate relative to the surface 101211 of the first protrusion and the slot surface 101121 of the first arc-shaped slot in a process in which the first connector 10513 moves in the first track slot 1013, to improve smoothness of movement of the first rotating assembly 1051.

Figure 14:
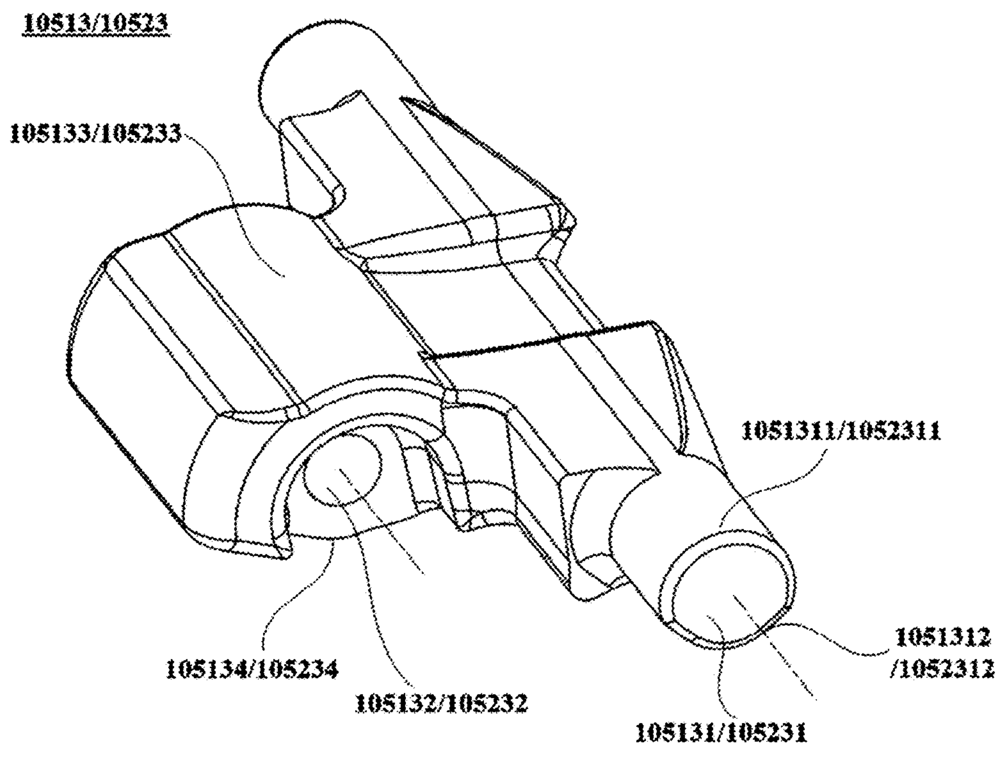
FIG. 14 is a diagram of a structure of a first connector according to an embodiment of this disclosure.

FIG. 14 is a diagram of a structure of the first connector 10513 according to an embodiment of this disclosure. In this disclosure, the first connector 10513 may include a first arc-shaped surface 105133 and a second arc-shaped surface 105134. To implement rotation of the first connector 10513 relative to the surface 101211 of the first protrusion and the slot surface 101121 of the first arc-shaped slot, the first arc-shaped surface 105133 and the second arc-shaped surface 105134 may be circular arc surfaces, and a center of the first arc-shaped surface 105133 coincides with a center of the second arc-shaped surface 105134. Radii of the first arc-shaped surface 105133 and the second arc-shaped surface 105134 may be equal or unequal, which is not limited in this disclosure. In addition, considering design tolerance, the first arc-shaped surface 105133 and the second arc-shaped surface 105134 may also be arc surfaces of other possible forms such as an elliptical arc surface, provided that the first connector 10513 can rotate relative to the surface 101211 of the first protrusion and the slot surface 101121 of the first arc-shaped slot.

Still refer to FIG. 9 and FIG. 13. When the electronic device is in the unfolded state shown in FIG. 9 and the folded state shown in FIG. 13, the first arc-shaped surface 105133 of the first connector 10513 may abut against the surface 101211 of the first protrusion, and the second arc-shaped surface 105134 abuts against the slot surface 101121 of the first arc-shaped slot. In this way, the surface 101211 of the first protrusion and the slot surface 101121 of the first arc-shaped slot limit the first connector 10513 to the first track slot 1013, so that when the hinge mechanism 1 is in the unfolded state and the folded state, the first connector 10513 is relatively stable without any gap-caused shake, and reliability of the hinge mechanism 1 is improved in the foregoing two states.

In this disclosure, when the electronic device is in the unfolded state shown in FIG. 9, a distance between a point at which the surface 101211 of the first protrusion abuts against the first arc-shaped surface 105133 and a point at which the slot surface 101121 of the first arc-shaped slot abuts against the second arc-shaped surface 105134 may be denoted as d1. When the electronic device is in the folded state shown in FIG. 13, a distance between a point at which the surface 101211 of the first protrusion abuts against the first arc-shaped surface 105133 and a point at which the slot surface 101121 of the first arc-shaped slot abuts against the second arc-shaped surface 105134 is denoted as d2. When the electronic device is in the unfolded state and the folded state, the first arc-shaped surface 105133 of the first connector 10513 may abut against the surface 101211 of the first protrusion, and the second arc-shaped surface 105134 abuts against the slot surface 101121 of the first arc-shaped slot. Therefore, when both the first arc-shaped surface 105133 and the second arc-shaped surface 105134 are circular arc surfaces, d1=d2 may be obtained.

In this disclosure, specific disposing forms of the surface 101211 of the first protrusion and the slot surface 101121 of the first arc-shaped slot are not limited. For example, the surface 101211 of the first protrusion may be a circular arc surface, and the slot surface 101121 of the first arc-shaped slot may be a circular arc surface. In addition, a circle center of the surface 101211 of the first protrusion coincides with a circle center of the slot surface 101121 of the first arc-shaped slot. In some other possible embodiments of this disclosure, both the surface 101211 of the first protrusion and the slot surface 101121 of the first arc-shaped slot may be configured as planes, so that the first track slot 1013 is a straight line slot. Alternatively, both the surface 101211 of the first protrusion and the slot surface 101121 of the first arc-shaped slot may be curved surfaces in other forms, so that the first track slot 1013 is a curved slot in any form, which should be understood as falling within the protection scope of this disclosure.

Still refer to FIG. 9. In this disclosure, the surface 101211 of the first protrusion may be equidistant from the slot surface 101121 of the first arc-shaped slot, and in this case, the first track slot 1013 is an equal-width slot. In the processes in which the electronic device changes from the unfolded state to the folded state and from the folded state to the unfolded state, the surface 101211 of the first protrusion keeps an abut-against state with the first arc-shaped surface 105133, and the slot surface 101121 of the first arc-shaped slot keeps an abut-against state with the second arc-shaped surface 105134. Therefore, in the processes in which the electronic device changes from the unfolded state to the folded state and from the folded state to the unfolded state, movement trajectories of the first connector 10513 may be the same. This can help improve movement stability of the first connector 10513, to improve movement stability of the first rotating assembly 1051.

Figure 15:
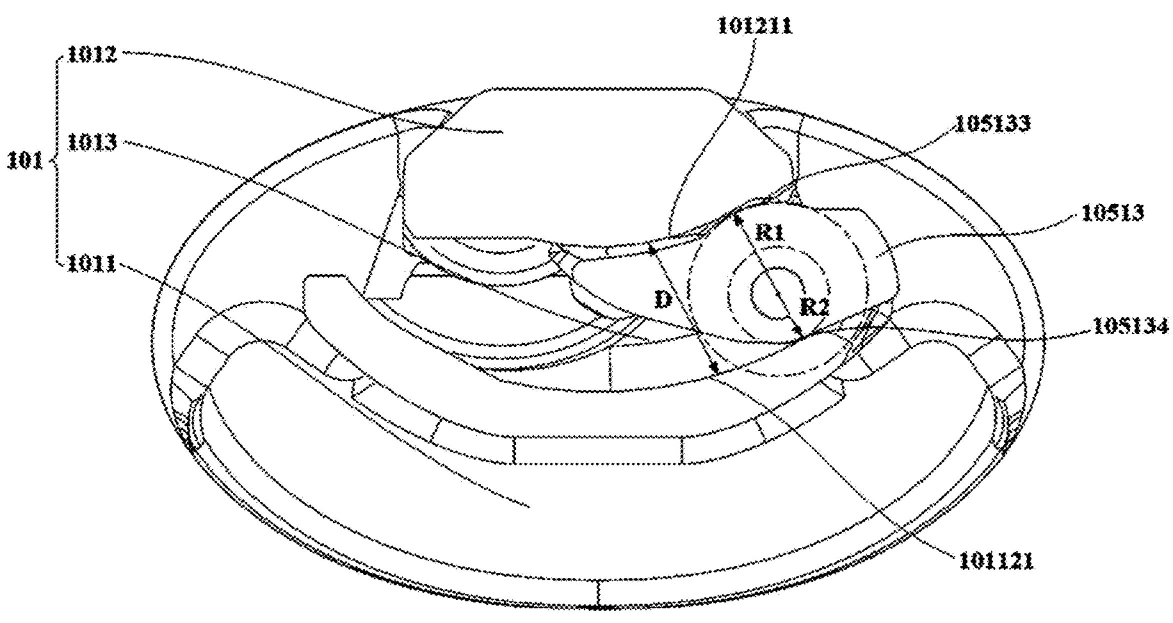
FIG. 15 is a diagram of an assembly structure of a first connector and a main shaft according to an embodiment of this disclosure.

FIG. 15 is a diagram of an assembly structure of the first connector 10513 and the main shaft 101 according to an embodiment of this disclosure. In this disclosure, when the first track slot 1013 is an equal-width slot, and the first arc-shaped surface 105133 and the second arc-shaped surface 105134 are circular arc surfaces, a sum of a radius R1 of the first arc-shaped surface 105133 and a radius R2 of the second arc-shaped surface 105134 is equal to a spacing D between the surface 101211 of the first protrusion and the slot surface 101121 of the first arc-shaped slot. In addition, in consideration of smoothness of movement of the first connector 10513 in the first track slot 1013, a specific design gap may be reserved between the first arc-shaped surface 105133 and the surface 101211 of the first protrusion, and/or between the second arc-shaped surface 105134 and the slot surface 101121 of the first arc-shaped slot.

In some other possible embodiments of this disclosure, a movement track of the first connector 10513 in the process in which the electronic device changes from the unfolded state to the folded state may be different from a movement track of the first connector 10513 in the process in which the electronic device changes from the folded state to the unfolded state. During specific implementation, in the process in which the electronic device changes from the unfolded state to the folded state, the first arc-shaped surface 105133 abuts against the surface 101211 of the first protrusion, and there is a gap between the second arc-shaped surface 105134 and the slot surface 101121 of the first arc-shaped slot. In addition, in the process in which the electronic device changes from the unfolded state to the folded state, the second arc-shaped surface 105134 abuts against the slot surface 101121 of the first arc-shaped slot, and there is a gap between the first arc-shaped surface 105133 and the surface 101211 of the first protrusion. In this embodiment, the surface 101211 of the first protrusion may be non-equidistant from the slot surface 101121 of the first arc-shaped slot, and in this case, the first track slot 1013 may be a non-equal-width slot.

It can be learned from the foregoing descriptions that, in this disclosure, the first swing arm 10511 may be rotatably connected to the main shaft 101, and the first swing arm 10511 may be rotatably connected to the main shaft 101 in a virtual shaft manner. This can help reduce space occupied by the first swing arm 10511 on the main shaft 101, to help reduce a volume of the rotating module 105, and implement a compact design for the hinge mechanism 1. In addition, it may be understood that, for the outward folding electronic device, when the first swing arm 10511 is rotatably connected to the main shaft 101 in a virtual shaft manner, an axis center at which the first swing arm 10511 rotates around the main shaft 101 is located on one side that is of the main shaft 101 and that is away from the flexible display.

Figure 16:
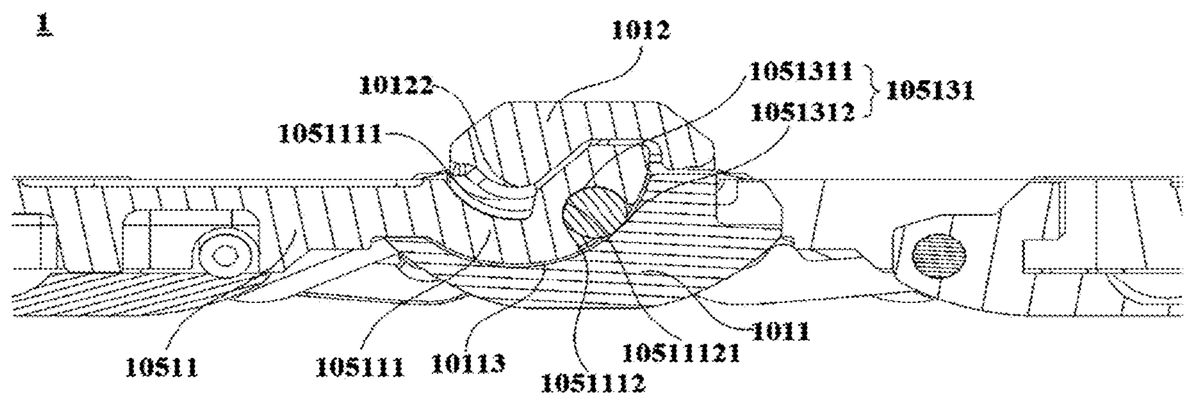
FIG. 16 is a C-C sectional view of the hinge mechanism shown in FIG. 3.

It should be noted that, in this disclosure, the virtual shaft is an axis center of a circular-arc-shaped structure. Two components that are rotatably connected are capable of rotating relative to the virtual shaft, and a position of the virtual shaft is fixed as the two components that are rotatably connected rotate relative to each other. For example, FIG. 16 is a C-C sectional view of the hinge mechanism 1 shown in FIG. 3. A first arc-shaped rotating block 105111 may be disposed at an end that is of the first swing arm 10511 and that faces the base 1011. In addition, refer to FIG. 11. The base 1011 may be provided with a second arc-shaped slot 10113. The first arc-shaped rotating block 105111 may be accommodated in the second arc-shaped slot 10113, and the first arc-shaped rotating block 105111 is capable of sliding along the slot surface of the second arc-shaped slot 10113. In this way, the rotation of the first swing arm 10511 around the main shaft 101 is implemented through sliding of the first arc-shaped rotating block 105111 along an arc-shaped surface of the second arc-shaped slot 10113. In addition, in this disclosure, the first arc-shaped rotating block 105111 may be but is not limited to a circular-arc-shaped rotating block, and the second arc-shaped slot 10113 may be but is not limited to a circular-arc-shaped slot. It may be understood that, when the first arc-shaped rotating block 105111 is a circular-arc-shaped rotating block, a surface that is of the first arc-shaped rotating block 105111 and that is in contact with the slot surface of the second arc-shaped slot 10113 may be a circular arc surface, the slot surface of the second arc-shaped slot 10113 is also a circular arc surface, and centers of the two circular arc surfaces coincide with each other.

Still refer to FIG. 12 and FIG. 16 together. The cover 1012 may include a second protrusion 10122 disposed toward the second arc-shaped slot 10113, at least a part of the first arc-shaped rotating block 105111 is located between the second protrusion 10122 and the second arc-shaped slot 10113, and the first arc-shaped rotating block 105111 may be in contact with a surface 101221 of the second protrusion. In this way, the first arc-shaped rotating block 105111 may be limited between the cover 1012 and the base 1011, and rotation stability of the first arc-shaped rotating block 105111 relative to the base 1011 can be effectively improved.

It should be noted that when the slot surface of the second arc-shaped slot 10113 is a circular arc surface, a part that is of the surface 101221 of the second protrusion and that is in contact with the first arc-shaped rotating block 105111 may also be a circular arc surface, and centers of the two circular arc surfaces coincide with each other. In addition, a surface that is of the first arc-shaped rotating block 105111 and that faces the second protrusion 10122 may be a plane or a circular arc surface, provided that the first arc-shaped rotating block 105111 can rotate relative to the second protrusion 10122.

Figure 17:
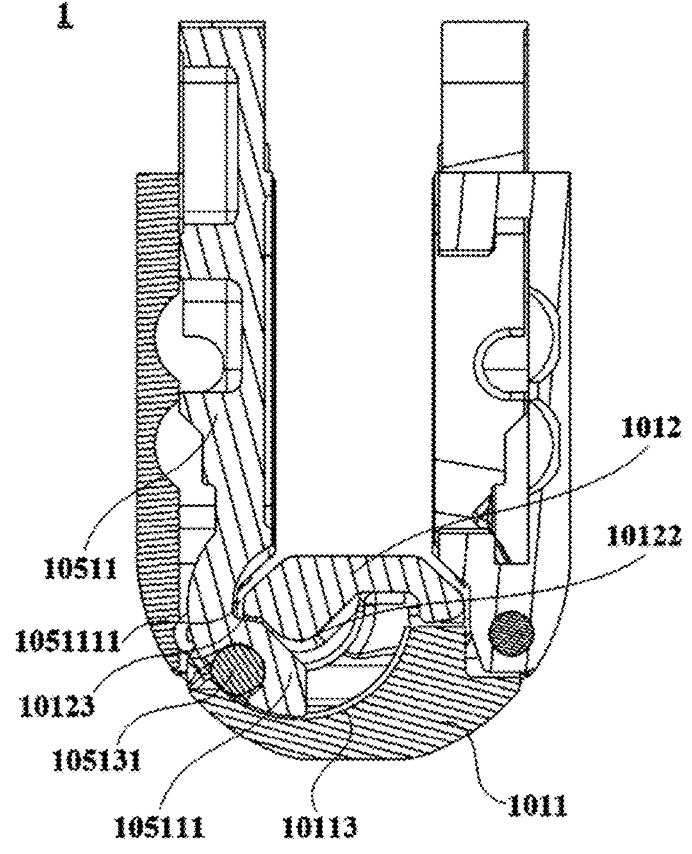
FIG. 17 is a sectional view of a first swing arm of a hinge mechanism when an electronic device is in a folded state according to an embodiment of this disclosure.

FIG. 17 is a sectional view of the first swing arm 10511 of the hinge mechanism 1 when the electronic device is in the folded state according to an embodiment of this disclosure. In this disclosure, the first arc-shaped rotating block 105111 may further be provided with a first recess 1051111, and an opening of the first recess 1051111 is disposed toward the cover 1012. In addition, a first insertion part 10123 may be disposed at an end part that is of the cover 1012 and that faces the first swing arm 10511. In this case, in the folded state, the first insertion part 10123 may be inserted into the first recess 1051111, and a surface that is of the first insertion part 10123 and that faces the second arc-shaped slot 10113 abuts against at least a part of a surface of the first recess 1051111. In this way, a rotation part of the first arc-shaped rotating block 105111 may be limited, and the first arc-shaped rotating block 105111 may be prevented from falling off from the second arc-shaped slot 10113, to improve reliability of a connection between the first swing arm 10511 and the main shaft 101, and improve structural reliability of the entire hinge mechanism 1.

It should be noted that, in this disclosure, in addition to being rotatably connected to the main shaft 101 in a virtual shaft manner, the first swing arm 10511 may be rotatably connected to the main shaft 101 in a solid shaft manner, so that the first swing arm 10511 can be connected to the main shaft 101 relatively reliably. It may be understood that, when the first swing arm 10511 is connected to the main shaft 101 in a solid shaft manner, an axis center at which the first swing arm 10511 rotates around the main shaft 101 is also located on one side that is of the main shaft 101 and that is away from the flexible display.

In this disclosure, when the first swing arm 10511 is rotatably connected to the first connector 10513, still refer to FIG. 14. The first connector 10513 may include a fifth rotating shaft 105131 and a sixth rotating shaft 105132, and an axis of the fifth rotating shaft 105131 is parallel to and does not coincide with an axis of the sixth rotating shaft 105132.

Figure 18:
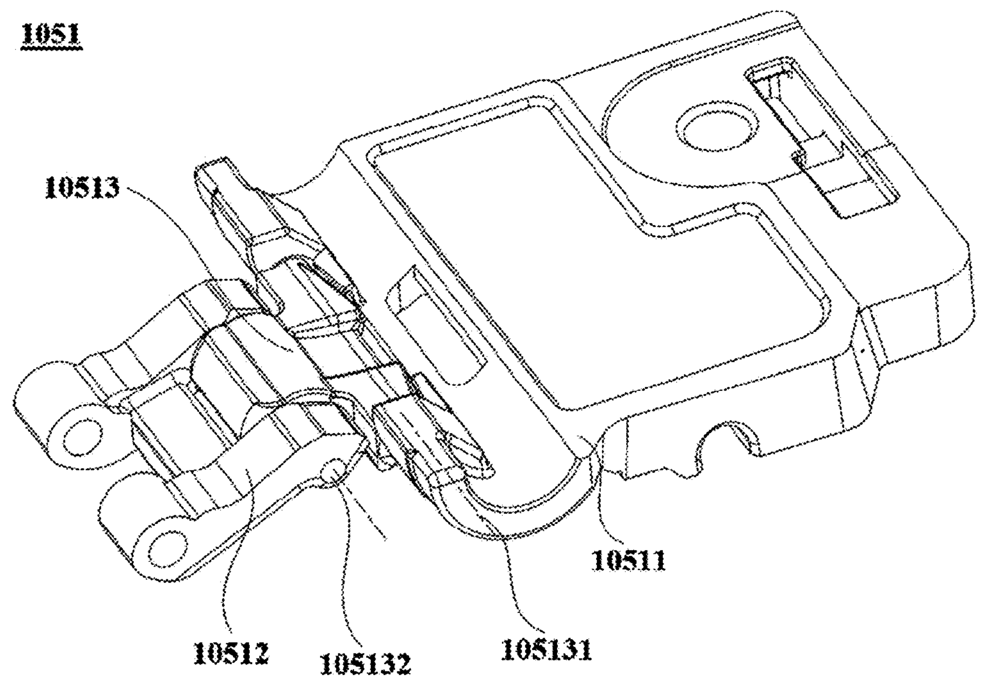
FIG. 18 is a diagram of a structure of a first rotating assembly according to an embodiment of this disclosure.

In addition, FIG. 18 is a diagram of a structure of the first rotating assembly 1051 according to an embodiment of this disclosure. The first connector 10513 is rotatably connected to the first swing arm 10511 via the fifth rotating shaft 105131, and the first connector 10513 is rotatably connected to the first support arm 10512 via the sixth rotating shaft 105132. In this way, the first swing arm 10511 and the first support arm 10512 may perform mutual pulling movement via the first connector 10513.

Figure 19:
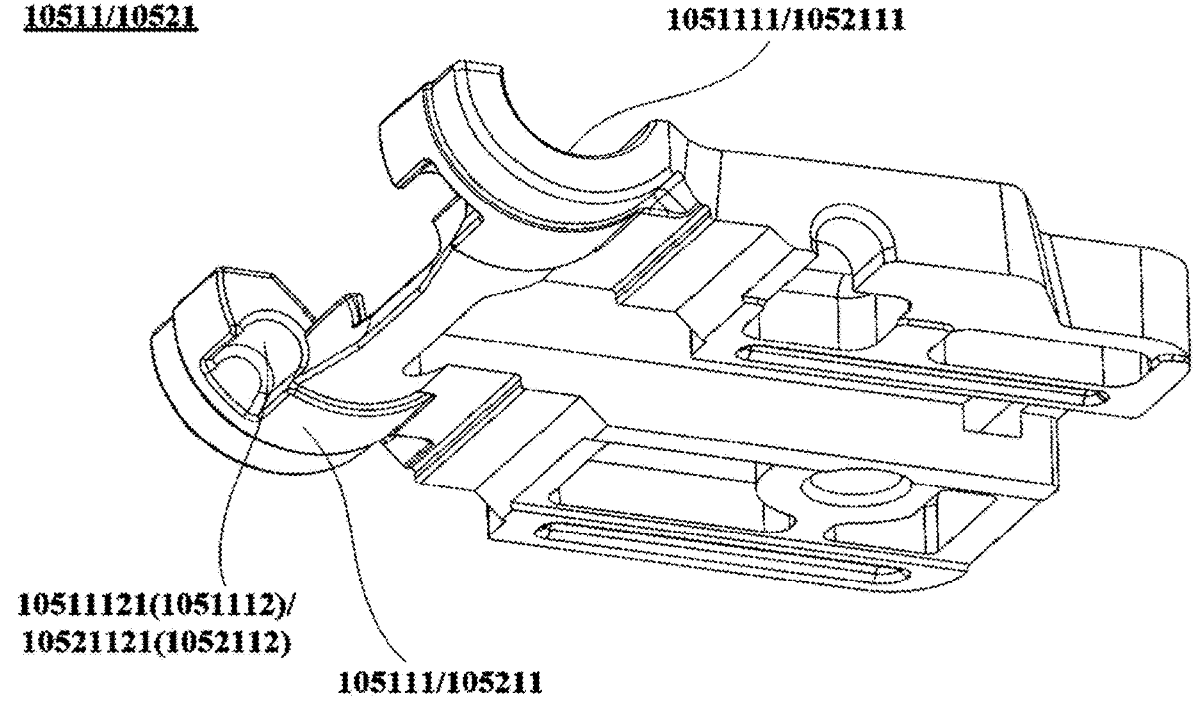
FIG. 19 is a diagram of a structure of a first swing arm according to an embodiment of this disclosure.

FIG. 19 is a diagram of a structure of the first swing arm 10511 according to an embodiment of this disclosure. The first arc-shaped rotating block 105111 of the first swing arm 10511 is provided with a first mounting slot 1051112. A slot opening of the first mounting slot 1051112 is disposed toward the second arc-shaped slot 10113, and the fifth rotating shaft 105131 may be mounted in the first mounting slot 1051112. A part of a surface of the fifth rotating shaft 105131 may be in contact with a slot surface of the first mounting slot 1051112, and a part of the surface of the fifth rotating shaft 105131 is in contact with the slot surface of the second arc-shaped slot 10113, to limit the fifth rotating shaft 105131 to the first mounting slot 1051112.

Still refer to FIG. 16 and FIG. 19. The slot surface of the first mounting slot 1051112 may include a first circular arc surface 10511121, the surface that is of the fifth rotating shaft 105131 and that is in contact with the slot surface of the first mounting slot 1051112 is a second circular arc surface 1051311, and a center of the first circular arc surface 10511121 coincides with a center of the second circular arc surface 1051311. In addition, refer to FIG. 11. The slot surface of the second arc-shaped slot 10113 may be a third circular arc surface 101131. However, as shown in FIG. 14, the surface that is of the fifth rotating shaft 105131 and that is in contact with the slot surface of the second arc-shaped slot 10113 may be a fourth circular arc surface 1051312, and a center of the third circular arc surface 101131 coincides with a center of the fourth circular arc surface 1051312. In this way, refer to FIG. 16 and FIG. 17 together. When the fifth rotating shaft 105131 slides along the slot surface of the second arc-shaped slot 10113 with the first arc-shaped rotating block 105111, the fifth rotating shaft 105131 may further rotate relative to the first arc-shaped rotating block 105111, to help implement movement of the first connector 10513 relative to the main shaft 101.

In this disclosure, when the first connector 10513 is rotatably connected to the first support arm 10512, as shown in FIG. 18, the sixth rotating shaft 105132 may penetrate both the first connector 10513 and the first support arm 10512. In this case, a connection manner of the first connector 10513 and the first support arm 10512 is relatively simple, which helps simplify a structure of the first rotating assembly 1051, so that a structure of the hinge mechanism 1 can be simplified. It should be noted that, when both the first arc-shaped surface 105133 and the second arc-shaped surface 105134 are circular arc surfaces, the center of the first arc-shaped surface 105133, the center of the second arc-shaped surface 105134, and an axis center of the sixth rotating shaft 105132 coincide with each other.

It may be understood that, in the hinge mechanism 1 provided in embodiments of this disclosure, the first connector 10513 may include a plurality of first sub-connectors that are sequentially rotatably connected. In addition, the plurality of first sub-connectors may be located between the first swing arm 10511 and the first support arm 10512, the first swing arm 10511 may be rotatably connected to a first sub-connector adjacent to the first swing arm 10511, and the first support arm 10512 may be rotatably connected to a first sub-connector adjacent to the first support arm 10512. For a manner in which the first swing arm 10511 is rotatably connected to the first sub-connector adjacent to the first swing arm 10511 and a manner in which the first support arm 10512 is rotatably connected to the first sub-connector adjacent to the first support arm 10512, refer to the foregoing descriptions of the rotatable connection of the first swing arm 10511 and the first support arm 10512 to the first connector 10513. Details are not described herein again. In this disclosure, the first connector 10513 is set as the plurality of first sub-connectors that are sequentially rotatably connected, so that the first swing arm 10511 and the first support arm 10512 are connected via the plurality of first sub-connectors. This can effectively improve speed uniformity in a process in which the first swing arm 10511 and the first support arm 10512 rotate around the main shaft 101, thereby improving smoothness of mutual pulling movement of the first swing arm 10511 and the first support arm 10512.

Still refer to FIG. 4. In this disclosure, the first swing arm 10511 may be further slidably connected to the first housing mounting bracket 103. During specific implementation, the first housing mounting bracket 103 is provided with a third sliding groove 1033. The third sliding groove 1033 extends along the first direction, and the first swing arm 10511 may be mounted in the third sliding groove 1033 and is capable of sliding along the first direction in the third sliding groove 1033. The first direction may be a direction along which the first housing mounting bracket 103 moves toward or away from the base 1011. In addition, to prevent the first swing arm 10511 from falling off from the third sliding groove 1033, a first sliding rail may be disposed on a sliding groove wall of the third sliding groove 1033, and a first sliding block may be disposed on the first swing arm 10511. In this way, the first sliding block may be clamped on the first sliding rail, and the first sliding block is capable of sliding along the first sliding rail, to limit the first swing arm 10511 to the third sliding groove 1033. In addition, the first sliding rail is disposed on the sliding groove wall of the third sliding groove 1033, which may provide guidance for sliding of the first swing arm 10511 along the third sliding groove 1033, to improve movement stability of the first swing arm 10511.

In this disclosure, the first support arm 10512 may be rotatably connected to the second housing mounting bracket 104. During specific implementation, still refer to FIG. 4. The second housing mounting bracket 104 is provided with a second mounting part 1042. An end part that is of the first support arm 10512 and that faces the second housing mounting bracket 104 is mounted on the second mounting part 1042, and an end part that is of the first support arm 10512 and that faces the second housing mounting bracket 104 is rotatably connected to the second mounting part 1042.

In embodiments of this disclosure, a specific manner in which the end part that is of the first support arm 10512 and that faces the second housing mounting bracket 104 is rotatably connected to the second mounting part 1042 is not limited. For example, still refer to FIG. 4. The second mounting part 1042 may be provided with a first mounting hole, and a second mounting hole is disposed at the end part that is of the first support arm 10512 and that faces the second housing mounting bracket 104. In this case, an end part that is of the first support arm 10512 and that faces the first housing mounting bracket 103 may be rotatably connected to the second mounting part 1042 via a rotating shaft that penetrates both the first mounting hole and the second mounting hole.

Figure 20:
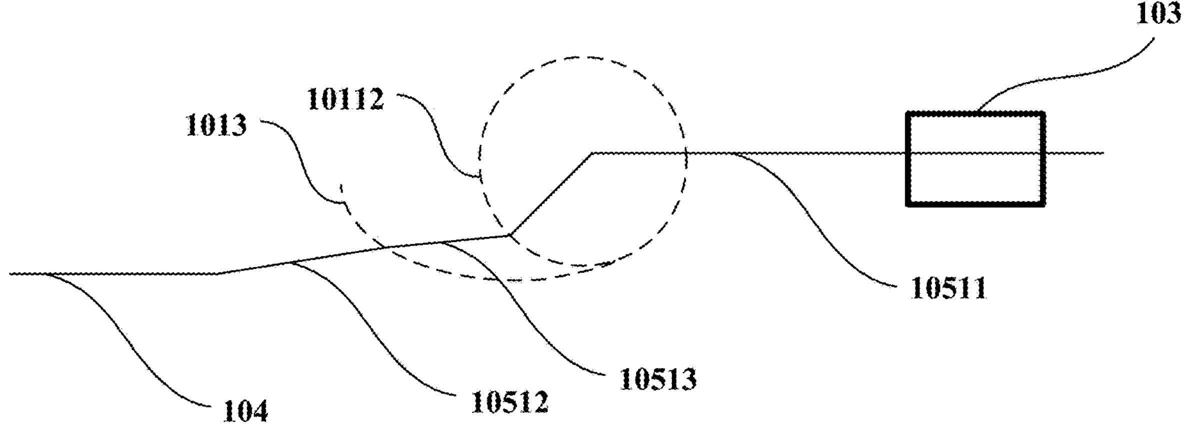
FIG. 20 is a diagram of a principle of a movement mechanism of a hinge mechanism according to an embodiment of this disclosure.

FIG. 20 is a diagram of a principle of a movement mechanism of the hinge mechanism 1 according to an embodiment of this disclosure. Based on the hinge mechanism 1 provided in the foregoing embodiments of this disclosure, in the process in which the electronic device changes from the unfolded state to the folded state, the first housing mounting bracket 103 and the second housing mounting bracket 104 move toward each other. When the first housing mounting bracket 103 drives the first swing arm 10511 to rotate around the main shaft 101 clockwise, the first swing arm 10511 is capable of sliding along the slot surface of the second arc-shaped slot 10113, so that the first connector 10513 may be driven to move toward the first swing arm 10511 in the first track slot 1013 of the main shaft 101. In addition, because the first connector 10513 is rotatably connected to the first support arm 10512, in a process in which the first connector 10513 moves toward the first swing arm 10511 in the first track slot 1013 of the main shaft 101, the first support arm 10512 may be driven to rotate around the main shaft 101 counter-clockwise, so that the first support arm 10512 drives the second housing mounting bracket 104 to rotate around the main shaft 101 counter-clockwise. In the process in which the electronic device changes from the folded state to the unfolded state, the first housing mounting bracket 103 and the second housing mounting bracket 104 move away from each other. When the first housing mounting bracket 103 drives the first swing arm 10511 to rotate around the main shaft 101 counter-clockwise, the first swing arm 10511 may drive the first connector 10513 to move toward the first support arm 10512 in the first track slot 1013 of the main shaft 101, and the first support arm 10512 may be driven to rotate around the main shaft 101 clockwise, so that the first support arm 10512 drives the second housing mounting bracket 104 to rotate around the main shaft 101 clockwise. In this way, folding and unfolding functions of the hinge mechanism 1 are implemented.

Some other hinge mechanisms need to thicken a rotating assembly connected to a main shaft to ensure stability of the mechanisms. In this way, both the main shaft and the hinge mechanism are very heavy. If the main shaft and the hinge mechanism are forcibly thinned, strength of the rotating assembly is easily weakened, thereby greatly affecting reliability of the hinge mechanisms and shortening a life of the electronic device. The hinge mechanism 1 in this disclosure has a simplified structure. According to the foregoing structural relationship, the first connector 10513 may be manufactured with a relatively small cross section to travel back and forth in the first track slot 1013 of the main shaft 101. In addition, the first connector 10513 has a sufficient length extension along a vertical axial direction, and separately has a connection relationship with the first swing arm 10511 and the first support arm 10512, so that reliability of the hinge mechanism 1 can be ensured. In this way, the thickness of the main shaft 101 and the thickness of the entire electronic device can be reduced, and reliability of the hinge mechanism 1 can be maintained, so that the entire hinge mechanism 1 is light, thin, and reliable.

In addition, because the first connector 10513 is capable of moving in the first track slot 1013 according to a specified track, uncontrolled movement of the first connector 10513 in an entire folding and unfolding process can be avoided, and random movement of the first housing mounting bracket 103 and the second housing mounting bracket 104 can further be avoided, to ensure structural stability and movement stability of the entire hinge mechanism 1. In some cases, the first track slot 1013 is appropriately designed, so that an outer tangent line of the hinge mechanism 1 can keep a constant length in the entire folding and unfolding process, and the flexible display covering the surface of the hinge mechanism 1 can also basically keep a length unchanged. In this way, squeezing or pulling on the flexible display can be effectively avoided, to improve structural reliability of the flexible display and further improve structural reliability of the electronic device.

Still refer to FIG. 4. Similarly structured as the first rotating assembly 1051, the second rotating assembly 1052 is set to be located between the first housing mounting bracket 103 and the second housing mounting bracket 104. In addition, the second rotating assembly 1052 may include a second swing arm 10521, a second support arm 10522, and a second connector 10523. The second connector 10523 is located between the second swing arm 10521 and the second support arm 10522, the second connector 10523 is rotatably connected to the second swing arm 10521, and the second connector 10523 is rotatably connected to the second support arm 10522. In this disclosure, the second connector 10523 may be rotatably connected to the second swing arm 10521 and the first support arm 10512 with reference to how the first connector 10513 is rotatably connected to the second swing arm 10521 and the second support arm 10522. For example, refer to FIG. 14. FIG. 14 may also be used to indicate a structure of the second connector 10523 according to this embodiment of this disclosure. The second connector 10523 may include a seventh rotating shaft 105231 and an eighth rotating shaft 105232, and an axis of the seventh rotating shaft 105231 is parallel to and does not coincide with an axis of the eighth rotating shaft 105232. The second connector 10523 may be rotatably connected to the second swing arm 10521 via the seventh rotating shaft 105231, and the second connector 10523 may be rotatably connected to the second support arm 10522 via the eighth rotating shaft 105232, so that the second swing arm 10521 and the second support arm 10522 perform mutual pulling movement via the second connector 10523.

In addition, refer to FIG. 10. The main shaft 101 may be provided with a second track slot 1014, and the second connector 10523 is capable of moving along the second track slot 1014, for limitation on a movement track of the second connector 10523. In practice, refer to FIG. 11. The base 1011 may be provided with a third arc-shaped slot 10114, the second connector 10523 is accommodated in the third arc-shaped slot 10114, and the second connector 10523 is capable of sliding along a slot surface 101141 of the third arc-shaped slot. In addition, refer to FIG. 12. The cover 1012 includes a third protrusion 10124. The third protrusion 10124 may be disposed toward the third arc-shaped slot 10114 of the base 1011 in FIG. 11. A gap exists between a surface 101241 of the third protrusion and the slot surface 101141 of the third arc-shaped slot, and the gap is used as the second track slot 1014.

In this disclosure, as shown in FIG. 14, the second connector 10523 may include a third arc-shaped surface 105233 and a fourth arc-shaped surface 105234. When the electronic device is in the unfolded state and the folded state, the third arc-shaped surface 105233 of the second connector 10523 may abut against the surface 101241 of the third protrusion, and the fourth arc-shaped surface 105234 abuts against the slot surface 101141 of the third arc-shaped slot. In this way, the surface 101241 of the third protrusion and the slot surface 101141 of the third arc-shaped slot limit the second connector 10523 to the second track slot 1014, so that when the hinge mechanism 1 is in the unfolded state and the folded state, the second connector 10523 is relatively stable without any gap-caused shake, and structural reliability of the hinge mechanism 1 is improved in the foregoing two states.

In this embodiment of this disclosure, the third arc-shaped surface 105233 of the second connector 10523 may be disposed with reference to the first arc-shaped surface 105133 of the first connector 10513, and the fourth arc-shaped surface 105234 may be disposed with reference to the second arc-shaped surface 105134 of the first connector 10513. Details are not described herein again. In addition, the second track slot 1014 may be set with reference to the first track slot 1013. Simply speaking, spacings between the surface 101241 of the third protrusion and the slot surface 101141 of the third arc-shaped slot are equal, so that the second track slot 1014 is an equal-width slot. In this case, in the processes in which the electronic device changes from the unfolded state to the folded state and from the folded state to the unfolded state, the surface 101241 of the third protrusion keeps an abut-against state with the third arc-shaped surface 105233, and the slot surface 101141 of the third arc-shaped slot keeps an abut-against state with the fourth arc-shaped surface 105234. Therefore, in the processes in which the electronic device changes from the unfolded state to the folded state and from the folded state to the unfolded state, movement trajectories of the second connector 10523 in the second track slot 1014 are the same. Alternatively, in the process in which the electronic device changes from the unfolded state to the folded state, the third arc-shaped surface 105233 abuts against the surface 101241 of the third protrusion, and a gap exists between the fourth arc-shaped surface 105234 and the slot surface 101141 of the third arc-shaped slot. In the process in which the electronic device changes from the folded state to the unfolded state, the fourth arc-shaped surface 105234 abuts against the slot surface 101141 of the third arc-shaped slot, and a gap exists between the third arc-shaped surface 105233 and the surface 101241 of the third protrusion. In this way, a movement track of the second connector 10523 in the process in which the electronic device changes from the unfolded state to the folded state is different from a movement track of the second connector 10523 in the process in which the electronic device changes from the folded state to the unfolded state.

In this disclosure, the second swing arm 10521 is rotatably connected to the main shaft 101. The second swing arm 10521 and the main shaft 101 may be rotatably connected in a virtual shaft manner. In practice, refer to FIG. 11. The base 1011 may be provided with a fourth arc-shaped slot 10115. In addition, refer to FIG. 4 and FIG. 19. FIG. 19 may also show a structure of the second swing arm 10521. A second arc-shaped rotating block 105211 is disposed at an end that is of the second swing arm 10521 and that faces the base 1011. The second arc-shaped rotating block 105211 may be but is not limited to a circular-arc-shaped rotating block, and the fourth arc-shaped slot 10115 may be but is not limited to a circular-arc-shaped slot. The second arc-shaped rotating block 105211 may be accommodated in the fourth arc-shaped slot 10115, and is capable of sliding along the slot surface of the fourth arc-shaped slot 10115. In this way, the rotation of the second swing arm 10521 around the base 1011 is implemented through sliding of the second arc-shaped rotating block 105211 along the slot surface of the fourth arc-shaped slot 10115. This can help reduce space occupied by the second swing arm 10521 on the main shaft 101, to help reduce a volume of the rotating module 105, and implement a compact design for the hinge mechanism 1. It may be understood that, for the outward folding electronic device, when the second swing arm 10521 is rotatably connected to the main shaft 101 in a virtual shaft manner, an axis center at which the second swing arm 10521 rotates around the main shaft 101 is located on one side that is of the hinge mechanism 1 and that is away from the flexible display.

In addition, in this disclosure, the second arc-shaped rotating block 105211 may be but is not limited to a circular-arc-shaped rotating block, and the fourth arc-shaped slot 10115 may be but is not limited to a circular-arc-shaped slot. It may be understood that, when the second arc-shaped rotating block 105211 is a circular-arc-shaped rotating block, a surface that is of the second arc-shaped rotating block 105211 and that is in contact with the slot surface of the fourth arc-shaped slot 10115 may be a circular arc surface, the slot surface of the fourth arc-shaped slot 10115 is also a circular arc surface, and centers of the two circular arc surfaces coincide with each other.

In this disclosure, to improve stability of rotation of the second swing arm 10521 around the main shaft 101, as shown in FIG. 12, the cover 1012 further includes a fourth protrusion 10125 disposed toward the fourth arc-shaped slot 10115, at least a part of the second arc-shaped rotating block 105211 is located between the fourth protrusion 10125 and the fourth arc-shaped slot 10115, and a surface that is of the second arc-shaped rotating block 105211 and that faces the fourth protrusion 10125 may be in contact with a surface 101251 of the fourth protrusion. In this way, the second arc-shaped rotating block 105211 may be limited between the cover 1012 and the base 1011, and rotation stability of the second arc-shaped rotating block 105211 relative to the base 1011 can be effectively improved. In addition, when the slot surface of the fourth arc-shaped slot 10115 is a circular arc surface, a part that is of the surface 101251 of the fourth protrusion and that is in contact with the second arc-shaped rotating block 105211 may also be a circular arc surface, and centers of the two circular arc surfaces coincide with each other. In this disclosure, a surface that is of the second arc-shaped rotating block 105211 and that faces the fourth protrusion 10125 may be a plane or a circular arc surface, provided that the second arc-shaped rotating block 105211 can rotate relative to the fourth protrusion 10125 in a process in which the second arc-shaped rotating block 105211 slides along the slot surface of the fourth arc-shaped slot 10115.

To improve reliability of a connection between the second swing arm 10521 and the base 1011, the second arc-shaped rotating block 105211 may further be provided with a second recess 1052111, and an opening of the second recess 1052111 is disposed toward the cover 1012. In addition, a second insertion part (not shown in FIG. 4) may be disposed at an end part that is of the cover 1012 and that faces the second housing mounting bracket 104. In this case, in the folded state, the second insertion part may be inserted into the second recess 1052111, and a surface that is of the second insertion part and that faces the fourth arc-shaped slot 10115 abuts against at least a part of a surface of the second recess 1052111. In this way, a rotation part of the second arc-shaped rotating block 105211 may be limited, and the second arc-shaped rotating block 105211 may be prevented from falling off from the fourth arc-shaped slot 10115.

It should be noted that, in this disclosure, in addition to being rotatably connected to the main shaft 101 in a virtual shaft manner, the second swing arm 10521 may be rotatably connected to the main shaft 101 in a solid shaft manner, so that the first swing arm 10511 can be connected to the main shaft 101 relatively reliably. For the outward folding electronic device, when the second swing arm 10521 is rotatably connected to the main shaft 101 in a solid shaft manner, an axis center at which the second swing arm 10521 rotates around the main shaft 101 is also located on one side that is of the hinge mechanism and that is away from the flexible display.

Further, when the second connector 10523 is rotatably connected to the second swing arm 10521 via the seventh rotating shaft 105231, still refer to FIG. 19. The second arc-shaped rotating block 105211 is provided with a second mounting slot 1052112, and a slot opening of the second mounting slot 1052112 is disposed toward the fourth arc-shaped slot 10115. In this case, the seventh rotating shaft 105231 may be mounted in the second mounting slot 1052112, a part of the surface of the seventh rotating shaft 105231 may be in contact with a slot surface of the second mounting slot 1052112, and a part of the surface of the seventh rotating shaft 105231 is in contact with the slot surface of the fourth arc-shaped slot 10115, to limit the seventh rotating shaft 105231 to the second mounting slot 1052112.

As shown in FIG. 19, in this disclosure, the slot surface of the second mounting slot 1052112 may include a fifth circular arc surface 10521121. As shown in FIG. 14, the surface that is of the seventh rotating shaft 105231 and that is in contact with the slot surface of the second mounting slot 1052112 is a sixth circular arc surface 1052311, and a center of the fifth circular arc surface 10521121 coincides with a center of the sixth circular arc surface 1052311. In addition, the slot surface of the fourth arc-shaped slot 10115 is a seventh circular arc surface 101151, the surface that is of the seventh rotating shaft 105231 and that is in contact with the slot surface of the fourth arc-shaped slot 10115 may be an eighth circular arc surface 1052312, and a center of the seventh circular arc surface 101151 coincides with a center of the eighth circular arc surface 1052312. In this way, when the seventh rotating shaft 105231 slides along the slot surface of the fourth arc-shaped slot 10115 with the second arc-shaped rotating block 105211, the seventh rotating shaft 105231 may further rotate relative to the second arc-shaped rotating block 105211, to help implement movement of the second connector 10523 relative to the main shaft 101.

In embodiments of this disclosure, when the second connector 10523 is rotatably connected to the second support arm 10522 via the eighth rotating shaft 105232, the eighth rotating shaft 105232 may penetrate the second connector 10523 and the second support arm 10522 at the same time. In this case, a connection manner of the second connector 10523 and the second support arm 10522 is relatively simple, which helps simplify a structure of the second rotating assembly 1052, so that a structure of the hinge mechanism 1 can be simplified.

It may be understood that, in the hinge mechanism 1 provided in embodiments of this disclosure, the second connector 10523 may include a plurality of second sub-connectors that are sequentially rotatably connected. In addition, the plurality of second sub-connectors may be located between the second swing arm 10521 and the second support arm 10522. In this case, the second swing arm 10521 may be rotatably connected to an adjacent second sub-connector, and the second support arm 10522 may be rotatably connected to an adjacent second sub-connector. For a manner in which the second swing arm 10521 is rotatably connected to the adjacent second sub-connector and a manner in which the second support arm 10522 is rotatably connected to the adjacent second sub-connector, refer to the foregoing descriptions of the rotatable connection of the second swing arm 10521 and the second support arm 10522 to the second connector 10523. Details are not described herein again. In this disclosure, the second connector 10523 is set as the plurality of second sub-connectors that are sequentially rotatably connected, so that the second swing arm 10521 and the second support arm 10522 are rotatably connected via the plurality of second sub-connectors. This can effectively improve speed uniformity in a process in which the second swing arm 10521 and the second support arm 10522 rotate around the main shaft 101, thereby improving smoothness of mutual pulling movement of the second swing arm 10521 and the second support arm 10522.

In this disclosure, the second swing arm 10521 may be slidably connected to the second housing mounting bracket 104. During specific implementation, the second housing mounting bracket 104 is provided with a fourth sliding groove 1043. The fourth sliding groove 1043 and the second mounting part 1042 are disposed at a spacing along the length direction of the hinge mechanism 1. The fourth sliding groove 1043 extends along a second direction, and the second swing arm 10521 may be mounted in the fourth sliding groove 1043 and is capable of sliding along the second direction in the fourth sliding groove 1043. The second direction may be a direction along which the second housing mounting bracket 104 moves toward or away from the base 1011. In addition, to prevent the second swing arm 10521 from falling off from the fourth sliding groove 1043, a second sliding rail may be disposed on a sliding groove wall of the fourth sliding groove 1043, and a second sliding block may be disposed on the second swing arm 10521. In this way, the second sliding block may be clamped on the second sliding rail, and the second sliding block is capable of sliding along the second sliding rail, to limit the second swing arm 10521 to the fourth sliding groove 1043. In addition, the second sliding rail is disposed on the sliding groove wall of the fourth sliding groove 1043, which may provide guidance for sliding of the second swing arm 10521 along the fourth sliding groove 1043, to improve movement stability of the second swing arm 10521.

In addition, the second support arm 10522 may be rotatably connected to the first housing mounting bracket 103. During specific implementation, the first housing mounting bracket 103 is provided with a first mounting part 1032. Along the length direction of the hinge mechanism 1, the first mounting part 1032 and the third sliding groove 1033 are disposed at a spacing. An end part that is of the second support arm 10522 and that faces the first housing mounting bracket 103 is mounted on the first mounting part 1032, and an end part that is of the second support arm 10522 and that faces the first housing mounting bracket 103 is rotatably connected to the first mounting part 1032.

In embodiments of this disclosure, a specific manner in which the end part that is of the second support arm 10522 and that faces the first housing mounting bracket 103 is rotatably connected to the first mounting part 1032 is not limited. For example, still refer to FIG. 4. The first mounting part 1032 may be provided with a third mounting hole, and a fourth mounting hole is disposed at an end part that is of the second support arm 10522 and that faces the first housing mounting bracket 103. In this case, the end part that is of the second support arm 10522 and that faces the first housing mounting bracket 103 may be rotatably connected to the first mounting part 1032 via a rotating shaft that penetrates both the third mounting hole and the fourth mounting hole.

Based on the hinge mechanism 1 provided in the foregoing embodiments of this disclosure, in the process in which the electronic device changes from the unfolded state to the folded state, the first housing mounting bracket 103 and the second housing mounting bracket 104 move toward each other. When the second housing mounting bracket 104 drives the second swing arm 10521 to rotate around the main shaft 101 counter-clockwise, the second swing arm 10521 may drive the second connector 10523 to move toward the second swing arm 10521 in the second track slot 1014 of the main shaft 101. In addition, because the second connector 10523 is rotatably connected to the second support arm 10522, in the process in which the second connector 10523 moves toward the second swing arm 10521 in the second track slot 1014 of the main shaft 101, the second support arm 10522 may be driven to rotate around the main shaft 101 clockwise, so that the second support arm 10522 drives the first housing mounting bracket 103 to rotate around the main shaft 101 clockwise. In the process in which the electronic device changes from the folded state to the unfolded state, the first housing mounting bracket 103 and the second housing mounting bracket 104 move away from each other. When the second housing mounting bracket 104 drives the second swing arm 10521 to rotate around the main shaft 101 clockwise, the second swing arm 10521 may drive the second connector 10523 to move toward the second support arm 10522 in the second track slot 1014 of the main shaft 101, and the second support arm 10522 may be driven to rotate around the main shaft 101 counter-clockwise, so that the second support arm 10522 drives the first housing mounting bracket 103 to rotate around the main shaft 101 counter-clockwise. In this way, folding and unfolding functions of the hinge mechanism 1 are implemented.

Some other hinge mechanisms need to thicken a rotating assembly connected to a main shaft to ensure stability of the mechanisms. In this way, both the main shaft and the hinge mechanism are very heavy. If the main shaft and the hinge mechanism are forcibly thinned, strength of the rotating assembly is easily weakened, thereby greatly affecting reliability of the hinge mechanisms and shortening a life of the electronic device. The hinge mechanism 1 in this disclosure has a simplified structure. According to the foregoing structural relationship, the second connector 10523 may be manufactured with a relatively small cross section to travel back and forth in the second track slot 1014 of the main shaft 101. In addition, the second connector 10523 has a sufficient length extension along a vertical axial direction, and separately has a connection relationship with the second swing arm 10521 and the second support arm 10522, so that reliability of the hinge mechanism 1 can be ensured. In this way, the thickness of the main shaft 101 and the thickness of the entire electronic device can be reduced, and reliability of the hinge mechanism 1 can be maintained, so that the entire hinge mechanism 1 is light, thin, and reliable.

Because the second connector 10523 is capable of moving according to a specified track, uncontrolled movement of the second connector 10523 in an entire folding and unfolding process can be avoided, and random movement of the first housing mounting bracket 103 and the second housing mounting bracket 104 can further be avoided, to ensure structural stability and movement stability of the entire hinge mechanism 1. In some cases, the second track slot 1014 is appropriately designed, so that an outer tangent line of the hinge mechanism 1 can keep a constant length in the entire folding and unfolding process, and the flexible display covering the surface of the hinge mechanism 1 can also basically keep a length unchanged. In this way, squeezing or pulling on the flexible display can be effectively avoided, to improve structural reliability of the flexible display and further improve structural reliability of the electronic device.

Figure 21:
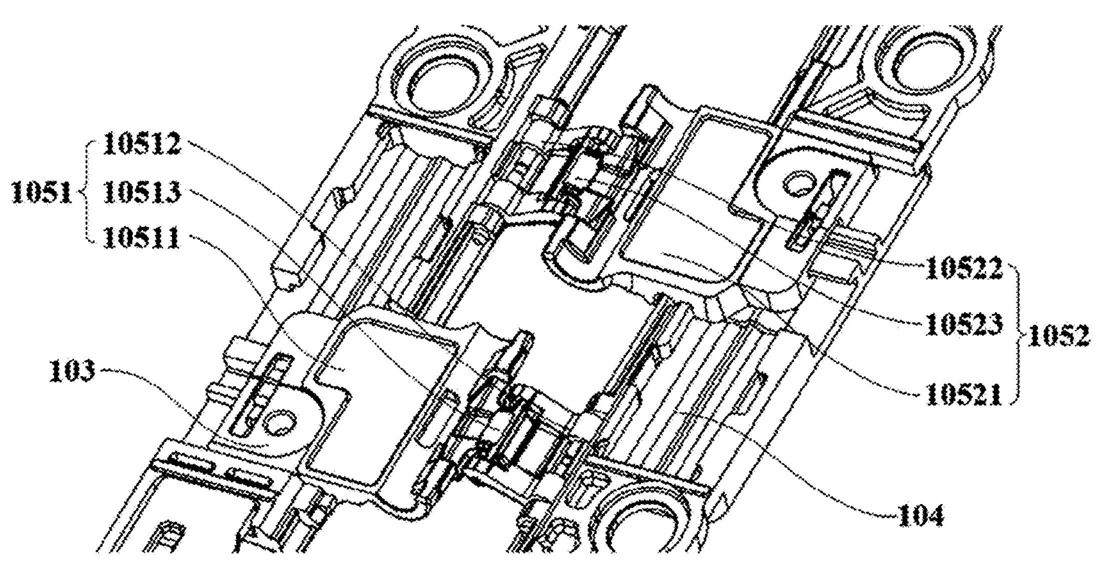
FIG. 21 is a diagram of a partial structure of a hinge mechanism according to an embodiment of this disclosure.

FIG. 21 is a diagram of a partial structure of the hinge mechanism 1 according to an embodiment of this disclosure. The main shaft 101 is omitted in FIG. 21, to help describe a mutual pulling movement relationship between the first rotating assembly 1051 and the second rotating assembly 1052. In this disclosure, the first swing arm 10511 is slidably connected to the first housing mounting bracket 103, the first support arm 10512 is rotatably connected to the second housing mounting bracket 104, and the first swing arm 10511 may pull, via the first connector 10513, the first support arm 10512 to move according to a specified track, and the second swing arm 10521 is slidably connected to the second housing mounting bracket 104, the second support arm 10522 is rotatably connected to the first housing mounting bracket 103, and the second swing arm 10521 may pull, via the second connector 10523, the second support arm 10522 to move according to a specified track. This can limit movement distances of the first housing mounting bracket 103 and the second housing mounting bracket 104 toward or away from the main shaft 101, so that when the electronic device is in any folding state, a distance between the first housing mounting bracket 103 and the main shaft 101 is equal to a distance between the second housing mounting bracket 104 and the main shaft 101. In addition, in the processes in which the electronic device changes from the unfolded state to the folded state and from the folded state to the unfolded state, the first housing mounting bracket 103 is capable of moving at an equal distance relative to the main shaft 101, and the second housing mounting bracket 104 is capable of moving at an equal distance relative to the main shaft 101. In this way, when the hinge mechanism 1 may be used in the electronic device shown in FIG. 2B, an extension length of a support surface formed by the first housing, the second housing, and the hinge mechanism 1 in the unfolded state can adapt to a flattening length of the flexible display, and when the electronic device is in the folded state, a folding requirement of the foldable part of the flexible display can be met, so that deformation of the flexible display can be avoided, and squeezing or pulling stress on the flexible display can be reduced, to prolong a service life of the flexible display and improve reliability of the electronic device.

According to the hinge mechanism 1 provided in embodiments of this disclosure, a rotation function of the hinge mechanism 1 may be implemented through mutual pulling of the connecting rods. In addition, the two housing mounting brackets may synchronously rotate toward or away from each other by disposing the synchronization assembly 102. In addition, because structures of mechanisms for implementing the rotation function and a synchronization function of the hinge mechanism 1 are simple, the structure of the entire hinge mechanism 1 can be effectively simplified, to help implement a compact design for the hinge mechanism 1 and reduce costs of the hinge mechanism 1. Moreover, because the mechanisms for implementing the rotation function and the synchronization function of the hinge mechanism 1 are two independent mechanisms, a failure of either mechanism does not affect the implementation of the functions of the other mechanism, and the reliability of the hinge mechanism 1 can be effectively improved.

Figure 22:
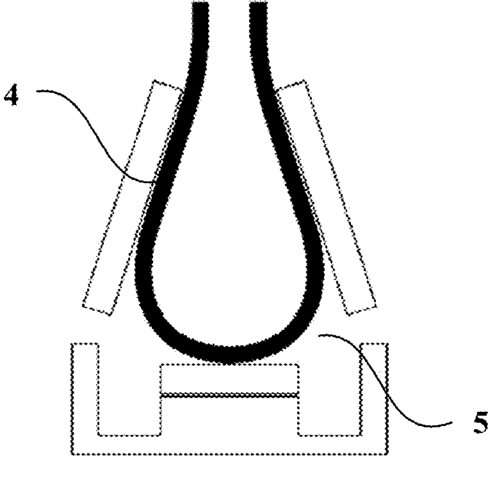
FIG. 22 is a diagram of a structure of an inward folding electronic device in a folded state according to an embodiment of this disclosure.

It should be noted that the synchronization assembly 102 described in the foregoing embodiment of this disclosure may be further used in the hinge mechanism 1 of the inward folding electronic device. FIG. 22 is a diagram of a structure of an inward folding electronic device in a folded state according to an embodiment of this disclosure. In a process in which the electronic device changes from an unfolded state to the folded state, the first housing 2 and the second housing 3 synchronously rotate toward each other, so that parts that are of the flexible display and that are fastened to the two housings can be driven to synchronously rotate. In this way, stress on the flexible display can be relatively uniform, to effectively avoid deformation of the flexible display and reduce a risk of damage to the flexible display. Refer to FIG. 8 and FIG. 22 together. When the electronic device is in the folded state, display accommodation space 5 configured to accommodate the foldable part of the flexible display 4 may be formed among the first gear assembly 1021, the second gear assembly 1022, and the main shaft 101. The display accommodation space may perform avoidance for the foldable part of the flexible display 4, so that squeezing on the foldable part of the flexible display 4 can be avoided, and structural reliability of the flexible display 4 can be effectively improved.

In addition, in a process in which the electronic device changes from the folded state to the unfolded state, the first housing 2 and the second housing 3 synchronously rotate away from each other, so that parts that are of the flexible display 4 and that are fastened to the two housings can be driven to synchronously rotate. In addition, when the electronic device is in the unfolded state, the bearing surface 1*a* of the hinge mechanism 1, the first support surface 2*a* of the first housing 2, and the second support surface 3*a* of the second housing 3 jointly flatly support the flexible display 4. This can ensure a complete form of the electronic device in the unfolded state.

It may be understood that, for the inward folding electronic device, when the first swing arm 10511 and the second swing arm 10521 are rotatably connected to the main shaft 101 via virtual shafts, axis centers at which the first swing arm 10511 and the second swing arm 10521 rotate around the main shaft 101 are located on one side that is of the main shaft 101 and that faces the flexible display 4. In addition, it should be noted that, when the synchronization assembly 102 is used in the hinge mechanism 1 of the inward folding electronic device, the first gear connecting rod 10211 and the third gear connecting rod 10212 may be slidably connected to the corresponding housing mounting bracket, each of the two gear connecting rods may also be rotatably connected to the corresponding housing mounting bracket via the rotating shafts. Alternatively, each of the two gear connecting rods may also be fixedly connected to the corresponding housing mounting bracket, and a fixed connection manner may be but is not limited to welding, riveting, threaded connection, or the like.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

The invention claimed is:

1. A hinge mechanism of a foldable electronic device, wherein the hinge mechanism comprises:
- a main shaft comprising a first side, a second side, and a rotating support member, wherein the rotating support member comprises:
  - a third side;
  - a fourth side;
  - a first end part;
  - a second end part;
  - a fifth gear surface disposed at the first end part; and
  - a sixth gear surface disposed at the second end part;
- a first housing mounting bracket disposed on the first side;
- a second housing mounting bracket disposed on the second side; and
- a synchronization assembly located between the first housing mounting bracket and the second housing mounting bracket and comprising:
  - a first gear assembly comprising:
    - a first gear connecting rod disposed on the third side and comprising:
      - a first gear facing the first end part and comprising a first gear surface engaged with the fifth gear surface; and
      - a first connecting rod slidably coupled to the first housing mounting bracket; and
    - a third gear connecting rod comprising:
      - a third gear comprising a third gear surface; and
      - a third connecting rod rotatably coupled to the first gear connecting rod; and
  - a second gear assembly comprising:
    - a second gear connecting rod disposed on the fourth side and comprising:
      - a second gear facing the second end part and comprising a second gear surface engaged with the sixth gear surface; and
      - a second connecting rod slidably coupled to the second housing mounting bracket; and
    - a fourth gear connecting rod comprising:
      - a fourth gear comprising a fourth gear surface engaged with the third gear surface; and
    - a fourth connecting rod rotatably coupled to the second gear connecting rod.

2. The hinge mechanism of claim 1, wherein the first gear assembly further comprises:
- a first rotating shaft configured to rotatably couple the third gear to the rotating support member; and
- a second rotating shaft configured to rotatably couple the third connecting rod to the first gear, wherein a first axis of the first rotating shaft is parallel to and does not coincide with a second axis of the second rotating shaft,
- wherein the second gear assembly further comprises:
  - a third rotating shaft configured to rotatably couple the fourth gear to the rotating support member; and
  - a fourth rotating shaft configured to rotatably couple the fourth connecting rod to the second gear, and
  - wherein a third axis of the third rotating shaft is parallel to and does not coincide with a fourth axis of the fourth rotating shaft.

3. The hinge mechanism of claim 1, wherein the first housing mounting bracket comprises a first sliding groove comprising a first opening that is disposed toward the main shaft, wherein the first connecting rod is mounted in the first sliding groove and is capable of sliding in the first sliding groove relative to the first housing mounting bracket toward or away from the main shaft, wherein the second housing mounting bracket comprises a second sliding groove comprising a second opening that is disposed toward the main shaft, and wherein the second connecting rod is mounted in the second sliding groove and is capable of sliding in the second sliding groove relative to the second housing mounting bracket toward or away from the main shaft.

4. The hinge mechanism of claim 1, wherein the main shaft further comprises a first track slot and a second track slot, and wherein the hinge mechanism further comprises a rotating module comprising:
- a first rotating assembly located between the first housing mounting bracket and the second housing mounting bracket and comprising:
  - a first swing arm rotatably coupled to the main shaft and slidably coupled to the first housing mounting bracket;
  - a first support arm rotatably coupled to the second housing mounting bracket; and
  - a first connector located between the first swing arm and the first support arm, rotatably coupled to the first swing arm, further rotatably coupled to the first support arm, and capable of moving along the first track slot for limitation on a first movement track of the first connector; and
- a second rotating assembly located between the first housing mounting bracket and the second housing mounting bracket and comprising:
  - a second swing arm rotatably coupled to the main shaft and slidably coupled to the second housing mounting bracket;
  - a second support arm rotatably coupled to the first housing mounting bracket; and
  - a second connector located between the second swing arm and the second support arm, rotatably coupled to the second swing arm, further rotatably coupled to the second support arm, and capable of moving along the second track slot for limitation on a second movement track of the second connector.

5. The hinge mechanism of claim 4, wherein the first connector comprises a first arc-shaped surface and a second arc-shaped surface, wherein the second connector comprises a third arc-shaped surface and a fourth arc-shaped surface, and wherein the main shaft comprises:
- a base comprising:

a first arc-shaped slot comprising a first slot surface configured to abut against the second arc-shaped surface when the electronic device is in an unfolded state and a folded state; and a second arc-shaped slot comprising a second slot surface configured to abut against the fourth arc-shaped surface when the electronic device is in the unfolded state and the folded state; and a cover covering the base and comprising:

a first protrusion disposed toward the first arc-shaped slot and comprising a first surface configured to abut against the first arc-shaped surface when the electronic device is in the unfolded state and the folded state; and a second protrusion disposed toward the second arc-shaped; slot and comprising a second surface configured to abut against the third arc-shaped surface when the electronic device is in the unfolded state and the folded state, and wherein the hinge mechanism further comprises:

a first gap located between the first surface and the first slot surface and serving as the first track slot; and a second gap located between the second surface and the second slot surface and serving as the second track slot.

6. The hinge mechanism of claim 5, wherein when the electronic device changes from the unfolded state to the folded state: the first arc-shaped surface is configured to abut against the first surface and form a third gap between the second arc-shaped surface and the first slot surface, and the third arc-shaped surface is configured to abut against the second surface and form a fourth gap between the fourth arc-shaped surface and the second slot surface, and when the electronic device changes from the folded state to the unfolded state: the second arc-shaped surface is configured to abut against the first slot surface and form a fifth gap between the first arc-shaped surface and the first surface, and the fourth arc-shaped surface is configured to abut against the second slot surface and form a sixth gap between the third arc-shaped surface and the second surface.

7. The hinge mechanism of claim 5, wherein the first surface is located equidistantly from the first slot surface wherein the second surface is located equidistantly from the second slot surface, wherein when the electronic device changes from the unfolded state to the folded state and from the folded state to the unfolded state: the first arc-shaped surface is configured to abut against the first surface, the second arc-shaped surface is configured to abut against the first slot surface, the third arc-shaped surface is configured to abut against the second surface, and the fourth arc-shaped surface is configured to abut against the second slot surface.

8. The hinge mechanism of claim 5, wherein the first arc-shaped surface is a first circular arc surface with a first radius, wherein the second arc-shaped surface is a second circular arc surface with a second radius, wherein a first sum of the first radius and the second radius is equal to a first spacing between the first surface and the first slot surface, wherein the third arc-shaped surface is a third circular arc surface with a third radius, wherein the fourth arc-shaped surface is a fourth circular arc surface with a fourth radius, and wherein a second sum of the third radius and the fourth radius is equal to a second spacing between the second surface and the second slot surface.

9. The hinge mechanism of claim 4, wherein the main shaft comprises a base comprising:

a first arc-shaped slot comprising a first slot surface; and a second arc-shaped slot comprising a second slot surface, wherein the first swing arm comprises a first arc-shaped rotating block accommodated in the first arc-shaped slot, wherein the first arc-shaped rotating block is capable of sliding along the first slot surface for rotatable coupling between the first swing arm and the main shaft, wherein the second swing arm comprises a second arc-shaped rotating block accommodated in the second arc-shaped slot, and wherein the second arc-shaped rotating block is capable of sliding along the second slot surface for rotatable coupling between the second swing arm and the main shaft.

10. The hinge mechanism of claim 9, wherein the main shaft further comprises a cover configured to cover the base and comprising:

a first protrusion disposed toward the first arc-shaped slot, wherein a first part of the first arc-shaped rotating block is located between the first protrusion and the first arc-shaped slot; and a second protrusion disposed toward the second arc-shaped slot, wherein a second part of the second arc-shaped rotating block is located between the second protrusion and the second arc-shaped slot.

11. The hinge mechanism of claim 9, wherein the first connector comprises a first rotating shaft and a second rotating shaft, wherein the first connector is rotatably coupled to the first swing arm via the first rotating shaft, wherein the first connector is rotatably coupled to the first support arm via the second rotating shaft, wherein a first axis of the first rotating shaft is parallel to and does not coincide with a second axis of the second rotating shaft, wherein the second connector comprises a third rotating shaft and a fourth rotating shaft, wherein rotatably coupled to the second swing arm via the third rotating shaft, wherein rotatably coupled to the second support arm via the fourth rotating shaft, wherein a third axis of the third rotating shaft is parallel to and does not coincide with a fourth axis of the fourth rotating shaft.

12. The hinge mechanism of claim 11, wherein the first arc-shaped rotating block comprises a first mounting slot, wherein the first mounting slot comprises a first slot opening disposed toward the first arc-shaped slot, wherein the first rotating shaft is mounted in the first mounting slot, wherein a first part of a first surface of the first rotating shaft is in contact with a third slot surface of the first mounting slot, wherein a second part of the first surface is in contact with the first slot surface, wherein the second arc-shaped rotating block comprises a second mounting slot, wherein the second mounting slot comprises a second slot opening disposed toward the second arc-shaped slot, wherein the third rotating shaft is mounted in the second mounting slot, wherein a third part of a second surface of the third rotating shaft is in contact with a fourth slot surface of the second mounting slot, and wherein a fourth part of the second surface is in contact with the second slot surface.

13. The hinge mechanism of claim 12, wherein the third slot surface comprises a first circular arc surface, wherein the first part of the first surface is a second circular arc surface, wherein a first center of the first circular arc surface coincides with a second center of the second circular arc surface, wherein the fourth slot surface comprises a fifth circular arc surface, wherein the third part of the second surface is a sixth circular arc surface, wherein a third center of the fifth circular arc surface coincides with a fourth center of the sixth circular arc surface, wherein the first slot surface is a third circular arc surface, wherein the second part of the first surface is a fourth circular arc surface, wherein a fifth center of the third circular arc surface coincides with a sixth center of the fourth circular arc surface, wherein the second slot surface is a seventh circular arc surface, wherein the fourth part of the second surface is an eighth circular arc surface, and wherein a seventh center of the seventh circular arc surface coincides with an eighth center of the eighth circular arc surface.

14. The hinge mechanism of claim 4, wherein the main shaft comprises:

a third side located away from the flexible display; and a fourth side located away from the flexible display, wherein a first axis center at which the first swing arm rotates around the main shaft is located on the third side, and wherein a second axis center at which the second swing arm rotates around the main shaft is located on the fourth side.

15. The hinge mechanism of claim 4, wherein the first connector comprises first sub-connectors that are sequentially rotatably coupled and that are located between the first swing arm and the first support arm, wherein the first swing arm is rotatably coupled to a third sub-connector that is of the first sub-connectors and that is adjacent to the first swing arm, wherein the first support arm is rotatably coupled to a fourth sub-connector that is of the first sub-connectors and that is adjacent to the first support arm, wherein the second connector comprises second sub-connectors that are sequentially rotatably coupled and that are located between the second swing arm and the second support arm, wherein the second swing arm is rotatably coupled to a fifth sub-connector that is of the second sub-connectors and that is adjacent to the second swing arm, and wherein the second support arm is rotatably coupled to a sixth sub-connector that is of the second sub-connectors and that is adjacent to the second support arm.

16. An electronic device comprising:

a first housing;

a second housing;

a flexible display that continuously covers the first housing, the second housing, and a hinge mechanism, fastened to the first housing and the second housing, and comprising a foldable part, wherein the hinge mechanism is disposed opposite to the foldable part and is configured to unfold or fold the electronic device, wherein the first housing and the second housing are disposed on two opposite sides of the hinge mechanism, and wherein the hinge mechanism comprises:

comprising a first side, a second side, and a rotating support member, wherein the rotating support member comprises:

a third side;

a fourth side;

a first end part;

a second end part;

a fifth gear surface disposed at the first end part; and a sixth gear surface disposed at the second end part;

a first housing mounting bracket disposed on the first side and fastened to the first housing;

a second housing mounting bracket disposed on the second side and fastened to the second housing; and a synchronization assembly located between the first housing mounting bracket and the second housing mounting bracket and comprising:

a first gear assembly comprising:

a first gear connecting rod disposed on the third side and comprising:

a first gear facing the first end part and comprising a first gear surface engaged with the fifth gear surface; and a first connecting rod slidably coupled to the first housing mounting bracket; and a third gear connecting rod comprising:

a third gear comprising a third gear surface; and a third connecting rod rotatably coupled to the first gear connecting rod; and a second gear assembly comprising:

a second gear connecting rod disposed on the fourth side and comprising:

a second gear facing the second end part and comprising a second gear surface engaged with the sixth gear surface; and a second connecting rod slidably coupled to the second housing mounting bracket; and a fourth gear connecting rod comprising:

a fourth gear comprising a fourth gear surface engaged with the third gear surface; and a fourth connecting rod rotatably coupled to the second gear connecting rod.

17. The electronic device of claim 16, wherein the first gear assembly further comprises:

a first rotating shaft configured to rotatably couple the third gear to the rotating support member; and a second rotating shaft configured to rotatably couple the third connecting rod to the first gear, wherein a first axis of the first rotating shaft is parallel to and does not coincide with a second axis of the second rotating shaft, wherein the second gear assembly further comprises:

a third rotating shaft configured to rotatably couple the fourth gear to the rotating support member; and a fourth rotating shaft configured to rotatably couple the fourth connecting rod to the second gear, and wherein a third axis of the third rotating shaft is parallel to and does not coincide with a fourth axis of the fourth rotating shaft.

18. The electronic device of claim 16, wherein the first housing mounting bracket comprises a first sliding groove comprising a first opening that is disposed toward the main shaft, wherein the first connecting rod is mounted in the first sliding groove and is capable of sliding in the first sliding groove relative to the first housing mounting bracket toward or away from the main shaft, wherein the second housing mounting bracket comprises a second sliding groove comprising a second opening that is disposed toward the main shaft, and wherein the second connecting rod is mounted in the second sliding groove and is capable of sliding in the second sliding groove relative to the second housing mounting bracket toward or away from the main shaft.

19. The electronic device of claim 16, wherein the main shaft further comprises a first track slot and a second track slot, and wherein the hinge mechanism further comprises a rotating module comprising:

a first rotating assembly located between the first housing mounting bracket and the second housing mounting bracket and comprising:

a first swing arm rotatably coupled to the main shaft and slidably coupled to the first housing mounting bracket;

a first support arm rotatably coupled to the second housing mounting bracket; and a first connector located between the first swing arm and the first support arm, rotatably coupled to the first swing arm, further rotatably coupled to the first support arm, and capable of moving along the first track slot for limitation on a first movement track of the first connector; and a second rotating assembly located between the first housing mounting bracket and the second housing mounting bracket and comprising:

a second swing arm rotatably coupled to the main shaft and slidably coupled to the second housing mounting bracket;

a second support arm rotatably coupled to the first housing mounting bracket; and a second connector located between the second swing arm and the second support arm, rotatably coupled to the second swing arm, further rotatably coupled to the second support arm, and capable of moving along the second track slot for limitation on a second movement track of the second connector.

20. The electronic device of claim 19, wherein the first connector comprises a first arc-shaped surface and a second arc-shaped surface, wherein the second connector comprises a third arc-shaped surface and a fourth arc-shaped surface, and wherein the main shaft comprises:

a base comprising:

a first arc-shaped slot comprising a first slot surface configured to abut against the second arc-shaped surface when the electronic device is in an unfolded state and a folded state; and a second arc-shaped slot comprising a second slot surface configured to abut against the fourth arc-shaped surface when the electronic device is in the unfolded state and the folded state; and a cover covering the base and comprising:

a first protrusion disposed toward the first arc-shaped slot and comprising a first surface configured to abut against the first arc-shaped surface when the electronic device is in the unfolded state and the folded state; and a second protrusion disposed toward the second arc-shaped slot; slot and comprising a second surface configured to abut against the third arc-shaped surface when the electronic device is in the unfolded state and the folded state, and wherein the hinge mechanism further comprises:

a first gap located between the first surface and the first slot surface and serving as the first track slot; and a second gap located between the second surface and the second slot surface and serving as the second track slot.

* * * * *